United States Patent
Park

(10) Patent No.: US 9,977,711 B2
(45) Date of Patent: May 22, 2018

(54) OPERATION METHOD OF NONVOLATILE MEMORY SYSTEM

(71) Applicant: SAMSUNG ELECTRONICS CO., LTD., Suwon-si (KR)

(72) Inventor: Young-Ho Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/374,506

(22) Filed: Dec. 9, 2016

(65) Prior Publication Data

US 2017/0168891 A1    Jun. 15, 2017

(30) Foreign Application Priority Data

Dec. 14, 2015  (KR) .................. 10-2015-0178371

(51) Int. Cl.
| | | |
|---|---|---|
| G11C 16/26 | (2006.01) | |
| G06F 11/10 | (2006.01) | |
| G06F 3/06 | (2006.01) | |
| G11C 16/34 | (2006.01) | |
| G11C 16/32 | (2006.01) | |

(52) U.S. Cl.
CPC .......... *G06F 11/1044* (2013.01); *G06F 3/064* (2013.01); *G06F 3/0608* (2013.01); *G06F 3/0679* (2013.01); *G11C 16/349* (2013.01); *G11C 16/26* (2013.01); *G11C 16/32* (2013.01)

(58) Field of Classification Search
CPC ..................................... G11C 16/26
USPC .................................... 365/185.33
See application file for complete search history.

(56) References Cited

U.S. PATENT DOCUMENTS

| | | | |
|---|---|---|---|
| 7,679,133 B2 | 3/2010 | Son et al. | |
| 8,316,278 B2 * | 11/2012 | Ahn | G06F 11/1068 365/185.09 |
| 8,433,981 B1 | 4/2013 | Agarwal et al. | |
| 8,553,466 B2 | 10/2013 | Han et al. | |
| 8,559,235 B2 | 10/2013 | Yoon et al. | |
| 8,599,609 B2 | 12/2013 | Franca-Neto et al. | |
| 8,654,587 B2 | 2/2014 | Yoon et al. | |
| 8,689,082 B2 * | 4/2014 | Oh | G11C 11/5628 714/764 |
| 8,760,921 B2 * | 6/2014 | Kawase | G06F 11/1048 365/185.09 |
| 8,930,778 B2 | 1/2015 | Cohen | |
| 8,972,824 B1 | 3/2015 | Northcott et al. | |
| 9,361,997 B2 * | 6/2016 | Lee | G11C 16/34 |
| 2009/0121271 A1 | 5/2009 | Son et al. | |
| 2009/0172267 A1 | 7/2009 | Oribe et al. | |
| 2010/0235713 A1 | 9/2010 | Lee et al. | |
| 2011/0216603 A1 | 9/2011 | Han et al. | |
| 2011/0233648 A1 | 9/2011 | Seol et al. | |
| 2012/0051143 A1 | 3/2012 | Yoon et al. | |
| 2012/0072683 A1 * | 3/2012 | Iliadis | G06F 12/0246 711/159 |
| 2012/0166707 A1 | 6/2012 | Franca-Neto et al. | |
| 2013/0232289 A1 | 9/2013 | Zhong et al. | |

(Continued)

*Primary Examiner* — Son Mai

(74) *Attorney, Agent, or Firm* — Sughrue Mion, PLLC

(57) ABSTRACT

An operation method of a nonvolatile memory system is provided. The method includes selecting a source block of memory blocks, performing a cell-counting with respect to the selected source block based on a reference voltage, and performing a reclaim operation on the source block based on the cell-counting result.

11 Claims, 18 Drawing Sheets

(56) References Cited

U.S. PATENT DOCUMENTS

| | | |
|---|---|---|
| 2013/0279262 A1 | 10/2013 | Yoon et al. |
| 2014/0101372 A1 | 4/2014 | Jung et al. |
| 2014/0136883 A1 | 5/2014 | Cohen |
| 2014/0136884 A1 | 5/2014 | Werner et al. |
| 2014/0156965 A1 | 6/2014 | Yang et al. |
| 2015/0138888 A1 | 5/2015 | Nagashima |
| 2015/0149817 A1 | 5/2015 | Strasser et al. |
| 2015/0169237 A1* | 6/2015 | Ioannou ............... G06F 3/0679 711/103 |
| 2015/0355845 A1* | 12/2015 | Lee ...................... G06F 3/0679 711/103 |
| 2016/0342458 A1* | 11/2016 | Cai ....................... G11C 29/44 |

\* cited by examiner

[Read Disturbance]

[Charge Loss]

OPERATION METHOD OF NONVOLATILE MEMORY SYSTEM

CROSS-REFERENCE TO RELATED APPLICATIONS

This application claims priority from Korean Patent Application No. 10-2015-0178371 filed Dec. 14, 2015 in the Korean Intellectual Property Office, the entire contents of which are hereby incorporated by reference.

BACKGROUND

Methods consistent with the present disclosure relate to a semiconductor memory, and more particularly, to an operation method of a nonvolatile memory system.

A semiconductor memory is implemented by using semiconductor such as silicon (Si), germanium (Ge), gallium arsenide (GaAs), indium phosphide (InP), or the like. A semiconductor memory device is roughly divided into a volatile memory device and a nonvolatile memory device.

A volatile memory device refers to a memory device which loses data stored therein at power-off. The volatile memory device includes a static random access memory (SRAM), a dynamic ram (DRAM), a synchronous DRAM or the like. A nonvolatile memory device refers to a memory device which retains data stored therein even at power-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

In particular, a flash memory device is a high-capacity storage device and is widely used in various fields. The flash memory device is a nonvolatile memory device but will lose data stored therein due to various factors such as temperature, read disturbance, program disturbance, and charge loss. Accordingly, there are being developed various methods for securing integrity of data stored in a flash memory device.

SUMMARY

Example embodiments provide an operation method of a nonvolatile memory system having improved performance and reliability.

According to an aspect of an example embodiment, an operation method of a nonvolatile memory system includes selecting a source block of a plurality of memory blocks; performing a cell-counting with respect to the selected source block based on at least one reference voltage; and performing a reclaim operation on the source block based on the cell-counting result.

According to an aspect of another example embodiment, an operation method of a nonvolatile memory system includes selecting a source block of a plurality of memory blocks; performing a reclaim operation on the source block during a first reclaim execution period when a threshold voltage of at least one of memory cells of the source block is higher than a upper limit of a threshold voltage distribution range of a target program state; and performing a reclaim operation on the source block during a second reclaim execution period different from the first reclaim execution period when a threshold voltage of at least one of memory cells of the source block is lower than the upper limit of the threshold voltage distribution range of the target program state.

According to an aspect of another example embodiment, an operation method of a nonvolatile memory system includes selecting a source block of a plurality of memory blocks; and performing a reclaim operation on the source block based on a program lapse time with respect to the source block or based on a read count after the source block is erased.

According to an aspect of another example embodiment, an operating method of a memory controller includes selecting a source block of a plurality of memory blocks, performing a cell-counting with respect to the source block by using at least one reference voltage and repeatedly performing reading at least one page data from a source block, correcting an error of the at least one read page data, and programming at least one page data, in which the error is corrected, in a destination block, based on the cell-counting result every read count. The memory controller controls a nonvolatile memory device including a plurality of memory block. The specific read count is different based on the cell-counting result.

According to an aspect of another example embodiment, an operation method of a nonvolatile memory system includes selecting a source block from a plurality of memory blocks, performing a cell-counting with respect to the selected source block based on at least one reference voltage, and performing a reclaim operation on the source block based on one reclaim mode of first and second reclaim modes and based on the cell-counting result.

According to an aspect of another example embodiment, an operation method of a nonvolatile memory system includes monitoring errors with respect to a source block of a plurality of memory blocks to determine an error type with respect to the source block; adjusting a reclaim policy based on the determined error type; and performing a reclaim operation on the source block using the adjusted reclaim policy.

BRIEF DESCRIPTION OF THE FIGURES

The above and other aspects will become apparent from the following description with reference to the following figures, wherein like reference numerals refer to like parts throughout the various figures unless otherwise specified, and wherein.

DETAILED DESCRIPTION

Hereinafter, example embodiments of the inventive concept in conjunction with accompanying drawings will be described.

A nonvolatile memory system according to an example embodiment may adjust a reclaim policy based on a type of error of a source block. Accordingly, a nonvolatile memory system having improved reliability and performance is provided.

Figure 1:
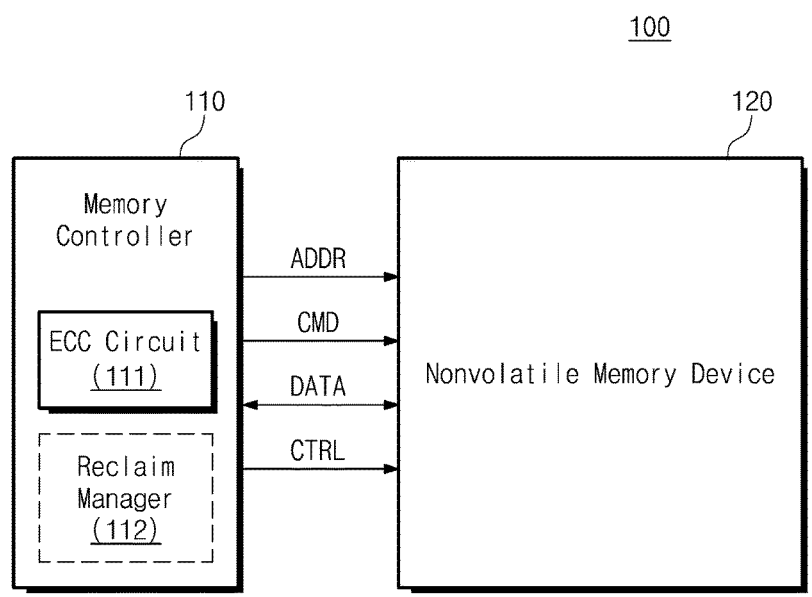
FIG. 1 is a block diagram illustrating a nonvolatile memory system according to an example embodiment.

FIG. 1 is a block diagram illustrating a nonvolatile memory system according to an example embodiment. Referring to FIG. 1, a nonvolatile memory system 100 may include a memory controller 110 and a nonvolatile memory device 120. Each of the memory controller 110 and the nonvolatile memory device 120 may be implemented with one chip, one package, or one module. In example embodiments, the nonvolatile memory system 100 may be a mass storage medium or a storage device such as a solid state drive (SSD), a memory card, and a memory stick.

The memory controller 110 may control the nonvolatile memory device 120 based on a request of an external device (e.g., a host, central processing unit (CPU), or application processor (AP)). For example, the memory controller 110 may transmit an address ADDR, a command CMD, and a control signal CTRL to the nonvolatile memory device 120 based on the request of an external device. The memory controller 110 may exchange data DATA with the nonvolatile memory device 120 based on the request of an external device.

Under control of the memory controller 110, the nonvolatile memory device 120 may store the data DATA therein or may output the data DATA stored therein. The nonvolatile memory device 120 may be provided based on a NAND flash memory including a plurality of memory blocks. However, an embodiment of the inventive concept may not be limited thereto. The nonvolatile memory device 120 may include nonvolatile memory devices such as a NOR flash memory, a magnetic RAM (MRAM), a phase-change RAM (PRAM), a resistive RAM (ReRAM), and a ferroelectric RAM (FRAM).

The nonvolatile memory device 120 may include a plurality of nonvolatile memory blocks. Each of the plurality of memory blocks may include a plurality of memory cells, and each of the plurality of memory cells may be a single level cell (SLC) storing one bit or a multi-level cell (MLC) storing at least two bits.

In example embodiments, the memory controller 110 may perform various operations for securing the integrity of data stored in the nonvolatile memory device 120. For example, the memory controller 110 may include an error correction code (ECC) circuit 111 and a reclaim manager 112. The ECC circuit 111 may generate an error correction code about data to be stored in the nonvolatile memory device 120 or may detect and correct an error of data read from the nonvolatile memory device 120 based on the error correction code.

In example embodiments, the ECC circuit 111 may has an error correction capability of a specific level. For example, the ECC circuit 111 may detect and correct an error that is corrected by using the error correction capability. In some example embodiments, the ECC circuit 111 may not detect and correct an error that is not corrected by using the error correction capability. Error data that is not corrected by the ECC circuit 111 may be referred to as 'uncorrectable error correction code (UECC) data'. When the data read from the nonvolatile memory device 120 is the UECC data, it may be difficult to secure the integrity of data read from the nonvolatile memory device 120.

To prevent the occurrence of UECC data, the reclaim manager 112 may perform a reclaim operation with respect to a memory block or page in which data including error bits of which the number is greater than or equal to a reference value is stored. For example, as a program, read, or erase operation about the nonvolatile memory device 120 is performed or as a time elapses, threshold voltages of a plurality of memory cells of the nonvolatile memory device 120 may change. This change may mean that an error is generated in the data read from the nonvolatile memory device 120. The ECC circuit 111 may detect an error bit in the data read from the nonvolatile memory device 120.

The reclaim manager 112 may compare the number of the detected error bits with the reference value to determine whether to reclaim a memory block in which the read data DATA is stored. When the number of the detected error bits is greater than the reference value, the reclaim manager 112 may select a memory block, in which the read data DATA is stored, as a source block. The reclaim manager 112 may perform a reclaim operation with respect to the source block, thereby securing the integrity of data stored in the source block.

The reclaim manager 112 according to an example embodiment may adjust a reclaim policy based on error cause (or error type) of data stored in the source block. For example, data stored in the source block may include errors due to various factors such as read disturbance, temperature, time, and the like.

The reclaim manager 112 may adjust a speed of the reclaim operation based on a data error type stored in the source block. In example embodiments, the speed of a reclaim operation (also called the reclaim speed) may indicate a time period from a point in time when a block is selected as the source block to a point in time when the reclaim operation is completed. Alternatively, the speed of a reclaim operation (also called the reclaim speed) may indicate a read count during a period from a point in time when a block is selected as the source block to a point in time when the reclaim operation is completed. Thus, if a speed of a reclaim operation is fast, the reclaim operation will be performed during first time period or first read counts, and if a speed of a reclaim operation is slow, the reclaim operation will be performed during second time period or second read counts. At this case, the first time period may be shorter than the second time period and the first read counts may be smaller than the second read counts. In example embodiments, the reclaim policy may include factors such as a reclaim speed, a reclaim execution period, the sub-operation period of a reclaim, the sub-operation unit of a reclaim.

In example embodiments, source blocks may be substantially selected at the same time according to the data error type. That is, a plurality of source blocks may be selected on a specific time interval or a specific read count interval, thereby a performance due to the reclaim operation may decrease. The reclaim manager 112 according to an example embodiment may adjust the reclaim operation or a reclaim policy based on the error type. Accordingly, even though a plurality of source blocks are selected at a specific time period or a specific read period, the reclaim manager 112 according to an example embodiment may perform the reclaim operation without a performance degradation.

Figure 2:
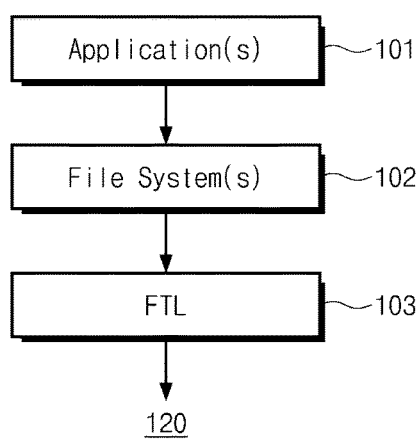
FIG. 2 is a block diagram illustrating a software layer of the nonvolatile memory system of FIG. 1.

FIG. 2 is a diagram illustrating a software layer of a nonvolatile memory system 100 of FIG. 1. Referring to FIGS. 1 and 2, the software layer of the nonvolatile memory system 100 may include one or more application(s) 101, one or more file system(s) 102, and a flash translation layer (FTL) 103. In example embodiments, the application(s) 101 and the file system(s) 102 may be included in an external device (e.g., a host, CPU, or AP) or may be driven by the external device.

The application(s) 101 may include various programs driven on the operating system of an external device. For example, the application(s) 101 may include various programs such as a text editor, a video player, and a web browser.

The file system(s) 102 may organize a file or data used by the application(s) 101. For example, the file system(s) 102 may provide an address of a file or data. In example embodiments, the address may be a logical address organized or managed by the external device. The file system(s) 102 may be provided in various formats determined according to an operating system. For example, the file system(s) 102 may include a file allocation table (FAT), FAT32, a new technology file system (NTFS), a hierarchical file system (HFS), a journaled file system2 (JSF2), an external file system (XFS), an on-disk structure-5 (ODS-5), a universal disk format (UDF), a zettabyte file system (ZFS), a UNIX file system (UFS), an EXT2, an EXT3, an EXT4, a ReiserFS, a Reiser4, an ISO 9660, a Gnome VFS, a broadcast file system (BFS), or a WinFS.

The FTL 103 may provide an interface between the external device and the nonvolatile memory device 120 to allow the nonvolatile memory device 120 to efficiently be used therein. For example, the FTL 103 may perform an operation to translate a logical address provided from an external device into a physical address to be used in the nonvolatile memory device 120. The FTL 103 may perform the above-described address translation operation through a mapping table.

In example embodiments, the FTL 103 may perform operations such as garbage collection, wear leveling, a reclaim operation, and the like. For example, the FTL 103 may perform the garbage collection to obtain a free block of the nonvolatile memory device 120. The FTL 103 may perform the wear leveling so as to level the number of P/E cycles of each of memory blocks in the nonvolatile memory device 130. In some example embodiments, the above-described reclaim manager 112 may be included in FTL 103, and the FTL 103 may perform a reclaim operation to secure the integrity of data.

Figure 3:
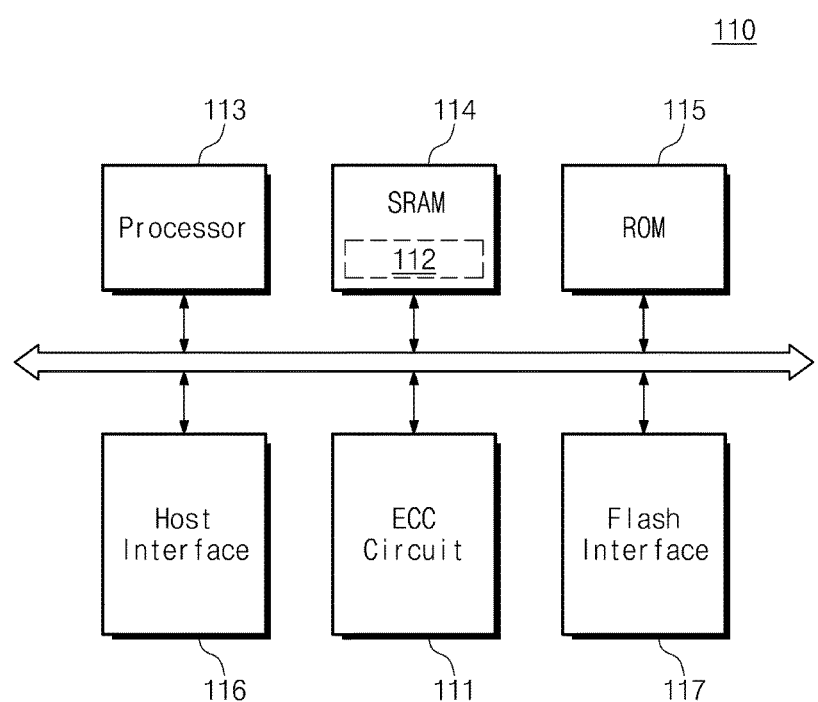
FIG. 3 is a block diagram illustrating a memory controller of the nonvolatile memory system of FIG. 1.

FIG. 3 is a block diagram illustrating a memory controller 110 illustrated in FIG. 1. Referring to FIGS. 1 and 3, the memory controller 110 may include the ECC circuit 111, a processor 113, an SRAM 114, a ROM 115, a host interface 116, and a flash interface 117.

The processor 113 may perform an overall operation of the memory controller 110. The processor 113 may include one or more microprocessors. The SRAM 114 may be used as a buffer memory, a cache memory, or a working memory of the memory controller 110. The ROM 115 may store a variety of information for the operation of the memory controller 110 in the form of firmware. In some example embodiments, the reclaim manager 112 of FIG. 1 may be provided in the form of software, and the reclaim manager 112 may be stored in the SRAM 114 and may be driven by the processor 113. In other example embodiments, the FTL 103 of FIG. 2 may be provided in the form of software, and the FTL 103 may be stored in the SRAM 114 and may be driven by the processor 113.

The memory controller 110 may communicate with an external device through the host interface 116. In example embodiments, the host interface 116 may be provided based on at least one communication protocol such as a universal serial bus (USB), a multimedia card (MMC), an embedded MMC (eMMC), a peripheral component interconnection (PCI), a PCI-express (PCI-E), an advanced technology attachment (ATA), a serial-ATA, a parallel-ATA, a small computer small interface (SCSI), an enhanced small disk interface (ESDI), an integrated drive electronics (IDE), a firewire, a universal flash storage (UFS), or a nonvolatile memory express (NVMe). The memory controller 110 may communicate with the nonvolatile memory device 120 through the flash interface 117.

Figure 4:
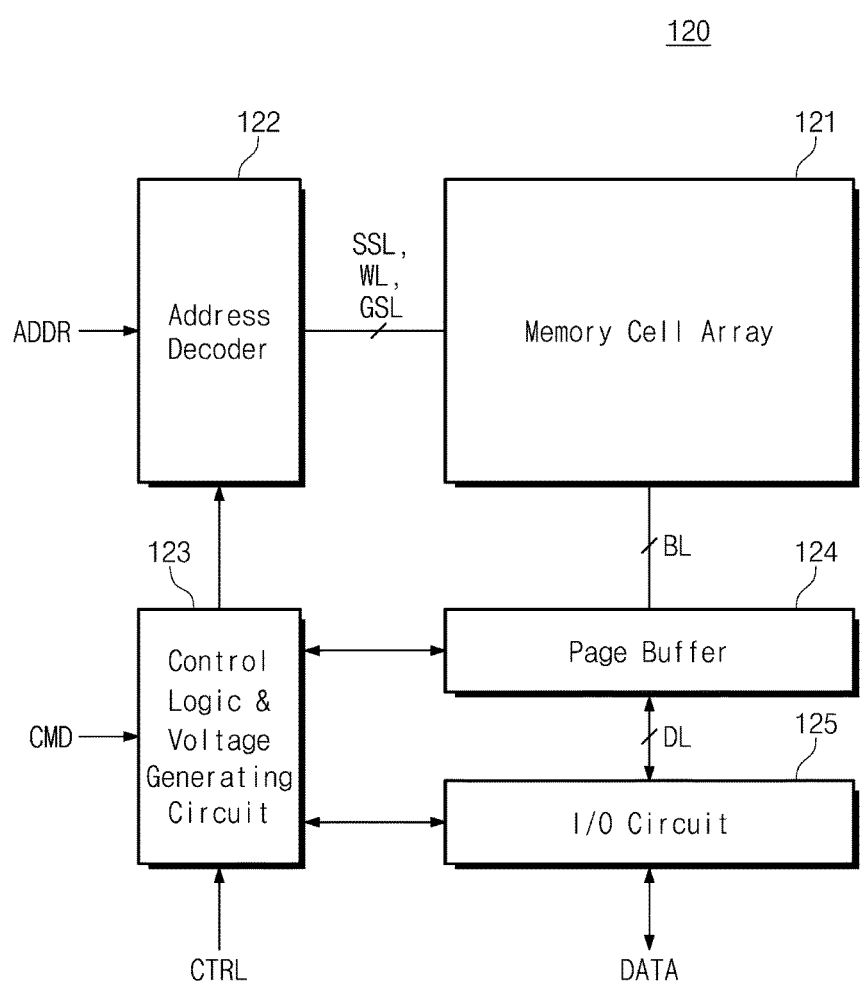
FIG. 4 is a block diagram illustrating a nonvolatile memory device of the nonvolatile memory system of FIG. 1.

FIG. 4 is a block diagram illustrating a nonvolatile memory device 120 of FIG. 1. Referring to FIGS. 1 and 4, the nonvolatile memory device 120 may include a memory cell array 121, an address decoder 122, control logic and a voltage generating circuit 123, a page buffer 124, and an input/output (I/O) circuit 125.

The memory cell array 121 may include a plurality of memory blocks. Each of the memory blocks may include a plurality of cell strings. Each of the cell strings may include a plurality of memory cells, and the memory cells may be connected with a plurality of word lines WL, respectively.

The address decoder 122 may be connected with the memory cell array 121 through the word lines WL, string selection lines SSL, and ground selection lines GSL. The address decoder 122 may receive the address ADDR from the memory controller 110 and decode the received address ADDR. The address decoder 122 may select at least one of the word lines WL based on the decoded address ADDR and may control the voltage of the selected word line.

The control logic and voltage generating circuit 123 may receive a command CMD and a control signal CTRL from the memory controller 110 and may control the address decoder 122, the page buffer 124, and the input/output (I/O) circuit 125 in response to the received signals.

The control logic and voltage generating circuit 123 may generate various voltages for the operation of the nonvolatile memory 120. For example, the control logic and voltage generating circuit 123 may generate various voltages such as program voltages, pass voltages, selection read voltages, non-selection read voltages, verification voltages, erase voltages, and erase verification voltages. In example embodiments, each of the various voltages such as the program voltages, the pass voltages, the selection read voltages, the non-selection read voltages, the verification voltages, the erase voltages, and the erase verification voltages may be changed according to the size, the operating speed, the physical location of each of the memory cells included in the memory cell array 121.

The page buffer 124 may be connected to the memory cell array 121 through a plurality of bit lines BL. The page buffer 124 may be connected to the input/output (I/O) circuit 125 through a plurality of data lines DL. The page buffer 124 may control the bit lines BL such that the data DATA received through the data lines DL is written in the memory cell array 121. The page buffer 124 may detect a voltage variation of the bit lines BL to read data stored in the memory cell array 121. The page buffer 124 may provide the read data DATA to the input/output circuit 125 through the data lines DL.

The input/output (I/O) circuit 125 may exchange the data DATA with the memory controller 110. Under control of the control logic and voltage generating circuit 123, the input/output (I/O) circuit 125 may receive the data DATA from the memory controller 110 or may output the data DATA to the memory controller 110 in synchronization with a control signal CTRL.

Figure 5:
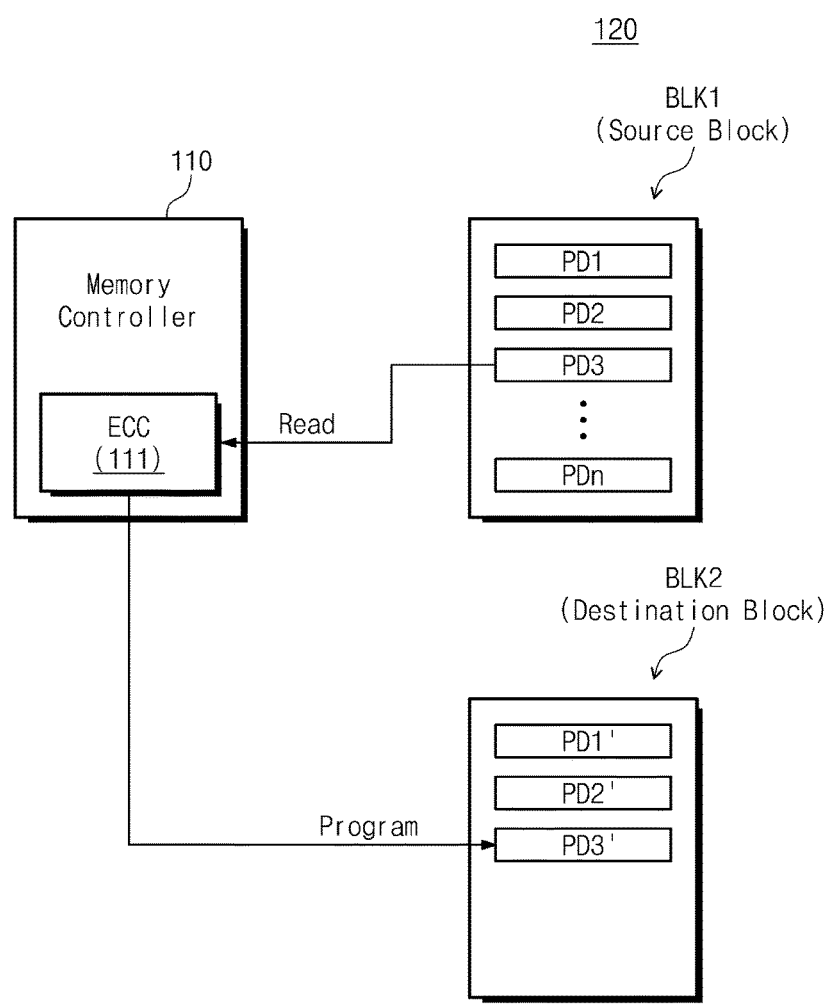
FIG. 5 is a block diagram illustrating a reclaim operation of the nonvolatile memory system of FIG. 1.

FIG. 5 is a block diagram illustrating a reclaim operation of a nonvolatile memory system 100 of FIG. 1. For descriptive convenience and ease of illustration, an error bit of data read from a specific memory block is referred to as "error bit of the memory block". Referring to FIGS. 1 and 5, the nonvolatile memory system 100 may select a first memory block BLK1 as a source block.

As described above, the memory controller 110 may read first page data PD1 included in the first memory block BLK1. An error of the first page data PD1 read from the first memory block BLK1 may be detected and corrected by the ECC circuit 111. At this time, the number of error bits detected from the read page data may be greater than the reference value. In this case, the memory controller 110 may select the first memory block BLK1, in which the first page data PD1 is stored, as the source block. In example embodiments, the source block may indicate a memory block corresponding to an object with respect to a read reclaim operation.

As illustrated in FIG. 5, the memory controller 110 may sequentially read first to third page data PD1 to PD3 from the first memory block BLK1 being the source block and may program the read page data in a second memory block BLK2 being a destination block. For example, the memory controller 110 may sequentially read the third page data PD3 from the first memory block BLK1, may correct an error of the third page data PD3, and may program the corrected third page data PD3' in the second memory block BLK2 being a destination block.

In example embodiments, an error of the first to third page data PD1 to PD3 read from the first memory block BLK1 may be corrected by the ECC circuit 111, and page data PD1' to PD3' of which the error is corrected may be programmed in the second memory block BLK2, respectively. That is, the first to third page data PD1' to PD3' of which the error is corrected may be programmed in the second memory block BLK2, and thus the integrity of data may be secured. As page data of which the error is corrected is programmed in the second memory block BLK2, the FTL 103 (refer to FIG. 2) may update a mapping table about page data of which the error is corrected.

Below, for descriptive convenience, it is assumed that a reclaim operation about the first memory block BLK1 being the source block includes a plurality of sub-operations. It is assumed that one sub-operation includes at least one of an operation of reading at least one page data from the source block, an operation of correcting an error of the at least one read page data, and an operation of programming a page data, of which the at least one error is corrected, in a destination block. Alternatively, it is assumed that one sub-operation includes repeating an operation of reading at least one page data from the source block, an operation of correcting an error of the at least one read page data, and an operation of programming a page data, of which the at least one error is corrected, in a destination block as a predetermined number of times. That is, the memory controller 100 may iteratively perform a plurality of sub-operations to complete a reclaim operation for one source block.

In example embodiments, the memory controller 110 may continuously or discontinuously perform each of a plurality of sub-operations. In some example embodiments, after performing a first sub-operation, the memory controller 110 may perform a second sub-operation after a specific read count. In other example embodiments, after performing a first sub-operation, the memory controller 110 may perform a second sub-operation after a specific read time elapses. However, the inventive concept may not be limited thereto.

Figure 6:
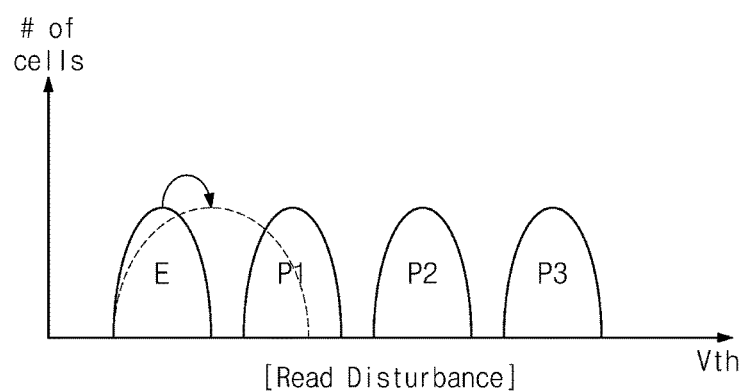
FIG. 6 are graphs illustrating a threshold voltage distribution of a plurality of memory cells included in the nonvolatile memory device of the nonvolatile memory system illustrated in FIG. 1.
Figure 6:
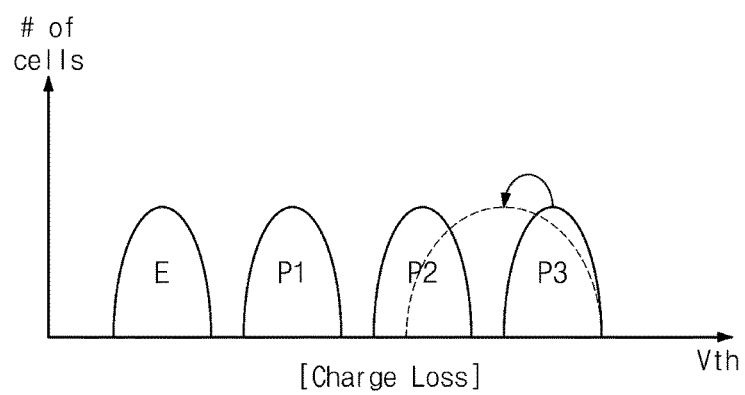

FIG. 6 are graphs illustrating a threshold voltage distribution of a plurality of memory cells included in the nonvolatile memory device 120 illustrated in FIG. 1. In FIG. 6, the abscissa represents threshold voltages Vth of memory cells, and the ordinate represents the number of memory cells. For concise description, it is assumed that each of a plurality of memory cells included in the nonvolatile memory device 120 is a multi-level cell (MLC) that stores 2-bit data. However, an embodiment of the inventive concept may not be limited thereto.

Referring to FIGS. 1 and 6, a plurality of memory cells included in the nonvolatile memory device 120 may be programmed to have one of an erase state E and first to third program states P1 to P3. The nonvolatile memory system 100 may read the data stored in the memory cells by detecting the threshold voltage of the memory cells.

A threshold voltage of each of the memory cells included in the nonvolatile memory device 120 may be changed due to various factors. For example, when read operations using a specific memory block, a specific word line, or a specific page are intensively performed in a specific period, threshold voltages of memory cells adjacent to the specific memory block, the specific word line, or the specific page may be changed. In more detail, when a read operation using the memory cells connected to the specific word line is repeatedly performed, the threshold voltages of memory cells of a word line adjacent to the specific word line may increase.

That is, as illustrated in the top graph of FIG. 6, a threshold voltage of memory cells of an erase state E may increase, and thus data stored in the memory cells may not be normally read. This may be referred to as "read disturbance". During a read operation, a pass voltage may continuously be applied to unselected word lines, and thus the read disturbance may occur. Here, the pass voltage may be a voltage that allows a memory cell to be turned on. Threshold voltages of memory cells due to read disturbance may increase to be higher than those of memory cells in a normal state, and thus an error in data stored in the memory cells may occur. In example embodiments, the normal state may indicate a target state (i.e., a target erase state or a target program state) of each of the memory cells.

In addition, after the memory cells are programmed, a threshold voltage of each of the memory cells may decrease as time elapses. In some example embodiments, the threshold voltage of each of the memory cells may decrease due to other factors. For example, a threshold voltage of each of the memory cells may decrease as charges stored in a charge storage layer (or film) of the memory cells are lost due to the physical characteristics of the memory cells.

That is, as illustrated in the bottom graph of FIG. 6, a threshold voltage of each of the memory cells having a third program state P3 may decrease. This may be referred to as "charge loss". The threshold voltages of the memory cells may decrease to be lower than that of the normal state due to the charge loss, and thus an error in data stored in the memory cells may occur.

Figure 7:
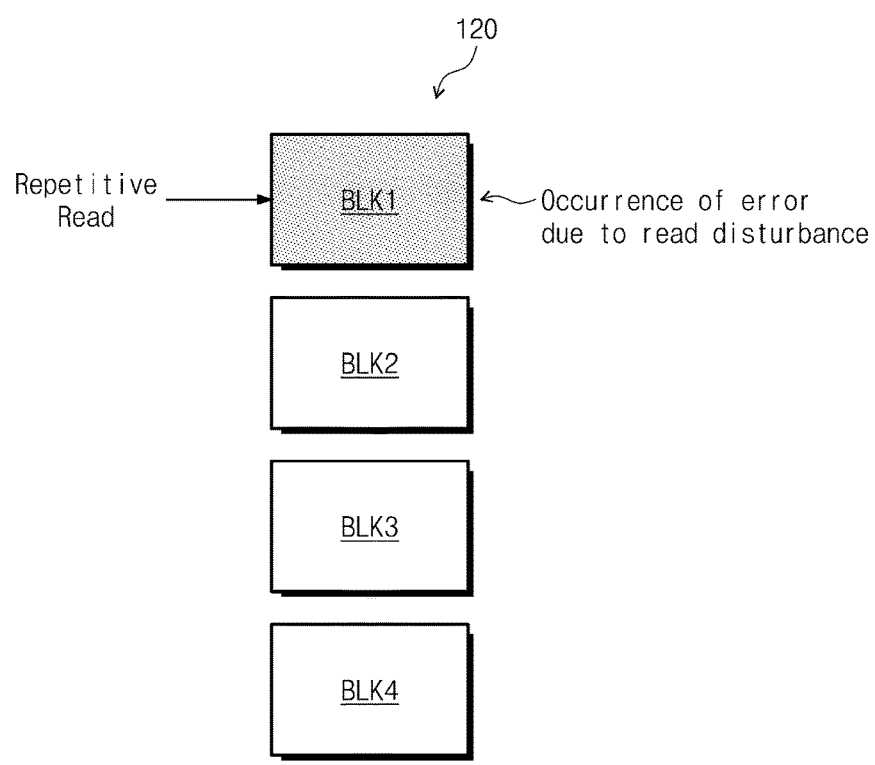
FIGS. 7 and 8 are diagrams illustrating a source block selection method based on an error type, according to example embodiments.
Figure 8:
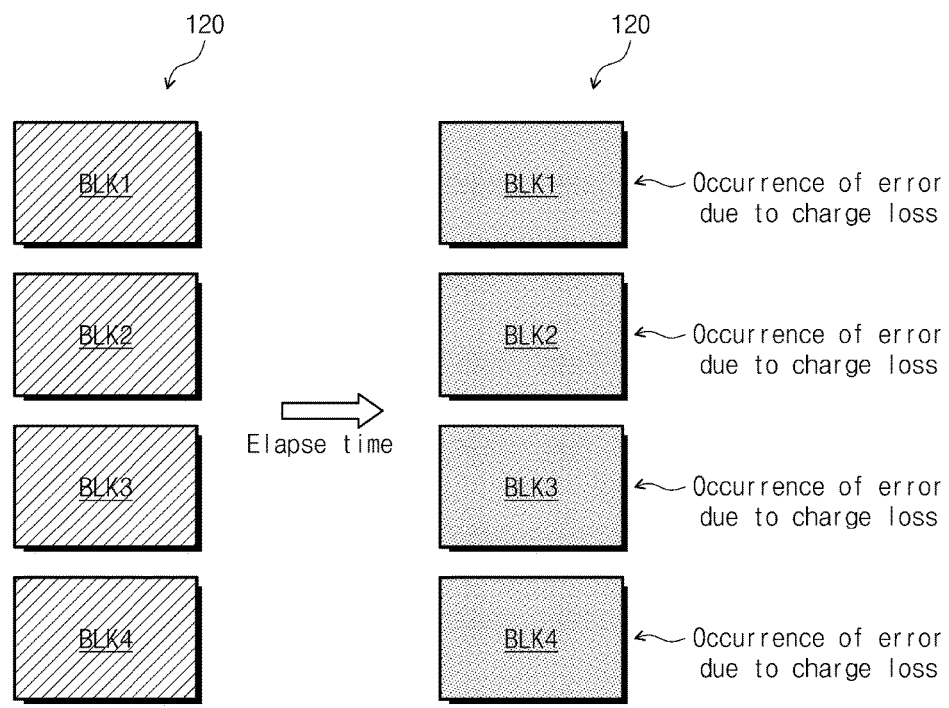

FIGS. 7 and 8 are diagrams illustrating a source block selection method based on an error type, according to example embodiments. For descriptive convenience, it is assumed that the nonvolatile memory device 120 includes first to fourth blocks BLK1 to BLK4, as shown in FIG. 7. In example embodiments, a source block selection method due to an occurrence of a read disturbance error may be described with reference to FIG. 7, and a source block selection method due to an occurrence of a charge loss error may be described with reference to FIG. 8.

First, referring to FIGS. 1 and 7, the nonvolatile memory system 100 may perform a read operation to read data stored in the nonvolatile memory device 120. At this time, the read operation from the first memory block BLK1 of the nonvolatile memory device 120 may be performed repeatedly. As described above, when a read operation using a specific memory block, a specific word line, or a specific page is performed repeatedly, an error due to the read disturbance may occur.

In contrast, when a read operation using second to fourth memory blocks BLK2 to BLK4 is not repeatedly performed, errors due to read disturbance may sporadically occur in the second to fourth memory blocks BLK2 to BLK4, as compared with a first memory block BLK1. That is, an error of data stored in the first memory block BLK1 may occur, and thus in such an exemplary situation, only the first memory block BLK1 may be selected as a source block for a reclaim operation.

Next, referring to FIGS. 1 and 8, the nonvolatile memory system 100 may program data in the first to fourth memory blocks BLK1 to BLK4 of the nonvolatile memory device 120. In example embodiments, a program operation using the first to fourth memory blocks BLK1 to BLK4 may be intensively performed many times during a specific time or a specific time interval. That is, each of the first to the fourth memory blocks BLK1 to BLK4 may include at least one page data programmed during a specific time or a specific time interval.

After a program operation using the first to fourth memory blocks BLK1 to BLK4 is performed, a specific time may elapse. In this case, as described above, threshold voltages of memory cells included in each of the first to fourth memory blocks BLK1 to BLK4 may be changed. In other words, at least a part of data stored in the first to fourth memory blocks BLK1 to BLK4 may include an error due to charge loss. When the number of errors included in one of the first to fourth memory blocks BLK1 to BLK4 is greater than or equal to a reference value, that one of the first to fourth memory blocks BLK1 to BLK4 may be selected as a source block for a reclaim operation.

As described above, a source block may be sporadically selected according to an error type during an operation of the nonvolatile memory system 100. Alternatively, in some example embodiments, a plurality of source blocks may be intensively selected according to the error type during a specific time or a specific time interval. When the plurality of source blocks are intensively selected during a specific time or a specific time interval, an operation according to a request of an external device (e.g., a host, CPU, or AP) may be delayed. That is, the performance of the nonvolatile memory system 100 may decrease due to a reclaim operation for the source blocks.

The nonvolatile memory system 100 according to an example embodiment may change a reclaim policy based on the error type. As such, even though the source blocks are simultaneously selected, the performance degradation may be minimized. Accordingly, the nonvolatile memory system may have improved reliability and performance.

Figure 9:
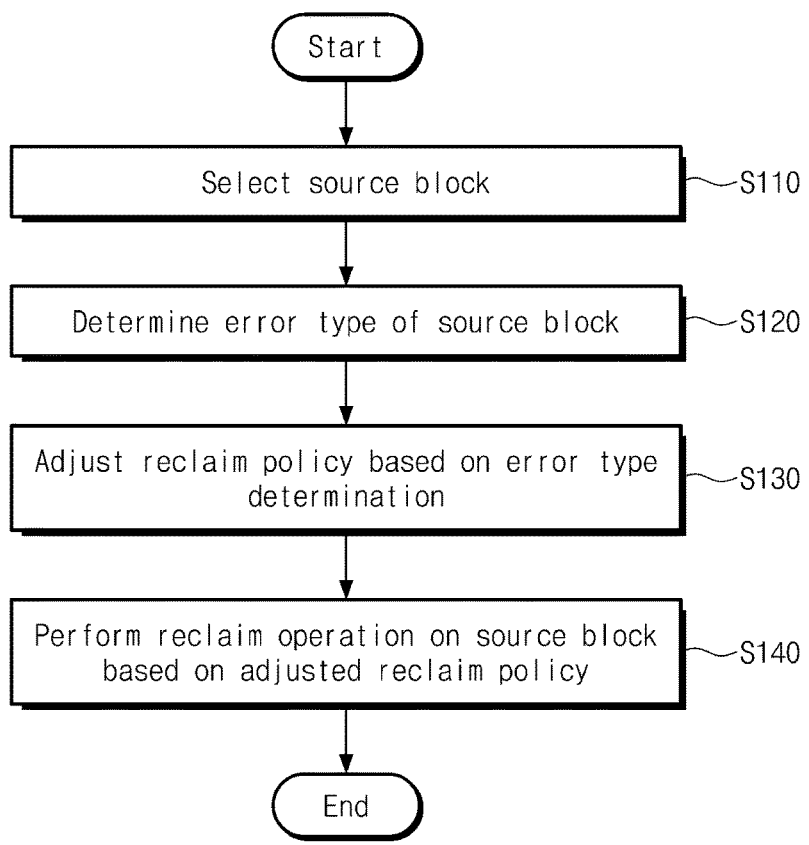
FIG. 9 is a flow chart illustrating an operation method of the nonvolatile memory system of FIG. 1.

FIG. 9 is a flow chart illustrating an operation method of a nonvolatile memory system 100 of FIG. 1. Below, for a concise explanation, it is assumed that the error type is at least one of an error due to read disturbance that causes the increase of threshold voltages of memory cells due to the read disturbance and an error due to charge loss that causes the decrease of threshold voltages of memory cells due to charge loss. However, an example embodiment may not be limited thereto.

Referring to FIGS. 1 and 9, in operation S110, the nonvolatile memory system 100 may select a source block. For example, during a read operation, the nonvolatile memory system 100 may compare the number of the detected errors with a reference value, and thus a memory block in which the read data is stored may be selected as a source block based on the comparison result. In some example embodiments, the nonvolatile memory system 100 may perform a reliability read operation based on various methods and may select the source block based on the result of the reliability read operation. In some example embodiments, the nonvolatile memory system 100 may read data stored in a memory block, a word line, or a page for each specific read count or specific time interval and may detect the number of errors of the read data. The nonvolatile memory system 100 may compare the number of the detected errors with the reference value and may select the source block based on the comparison result.

In operation S120, the nonvolatile memory system 100 may determine an error type of the source block. For example, the nonvolatile memory system 100 may scan a threshold voltage distribution of memory cells connected to at least one of word lines of the source block, and thus the error type of the source block may be determined. Alternatively, the nonvolatile memory system 100 may perform a cell counting operation by using at least one reference voltage, and thus the error type of the source block may be determined. In example embodiments, as described above, the error type may include at least one of a read disturbance error and a charge loss error. An error type determination method will be described in detail with reference to FIGS. 10 and 11.

In operation S130, the nonvolatile memory system 100 may adjust a reclaim policy based on the error type determination result. For example, when the error type determination result indicates an error due to read disturbance, the nonvolatile memory system 100 may adjust the reclaim policy such that a reclaim operation is performed based on a normal mode. Alternatively, when the error type determination result indicates an error due to charge loss, the nonvolatile memory system may adjust the reclaim policy such that a reclaim operation is performed based on a low speed mode.

In operation S140, the nonvolatile memory system 100 may perform a reclaim operation on the source block based on the adjusted reclaim policy. In some example embodiments, a reclaim operation in the low speed mode may be slower than that in the normal mode. For example, the reclaim operation in the low speed mode may perform a sub-operation once for each read count of 100. On the other hand, the reclaim operation in the normal mode may perform a sub-operation once for each read count of 10. That is, during the same read count, the number of sub-operations of the reclaim operation in the low speed mode may be less than the number of sub-operations of the reclaim operation in the normal mode. In other words, with regard to a time when a reclaim operation about one source block is completed, a time taken to perform a reclaim operation in the low speed mode may be longer than that taken to perform a reclaim operation in the normal mode. Alternatively, with regard to a read count when a reclaim operation about one source block is completed, a read count when a reclaim operation in the low speed mode is completed may be more than that when a reclaim operation in the normal mode is completed.

In example embodiments, the read count may indicate the number of read operations from a plurality of memory blocks included in the nonvolatile memory device 120. Alternatively, the read count may indicate the number of read operations from a source block of the memory blocks included in the nonvolatile memory device 120.

As described above, during a specific read count or a specific time interval, a plurality of source blocks including an error due to charge loss may be selected. The nonvolatile memory system 100 according to an example embodiment may lower a reclaim speed for source blocks including errors due to charge loss, thereby minimizing the overall performance degradation thereof.

Figure 10:
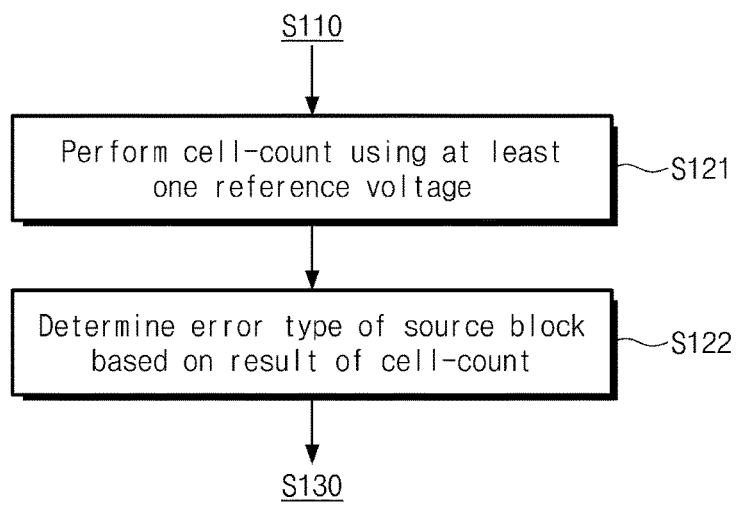
FIGS. 10 to 11 are diagrams illustrating operation 120 of the operation method of FIG. 9 in detail.
Figure 11:
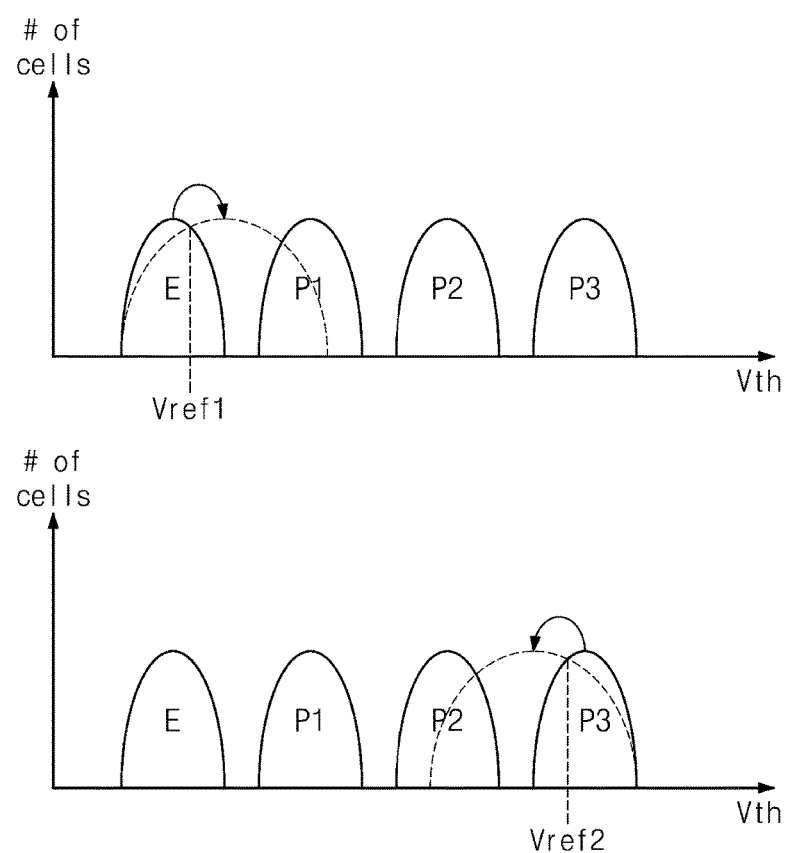

FIGS. 10 to 11 are diagrams illustrating operation S120 of the operation method of FIG. 9 in detail. Referring to FIGS. 1, 9, and 10, operation S120 may include operations S121 and S122.

In operation S121, the nonvolatile memory system 100 may perform a cell-count operation by using at least one reference voltage. For example, as illustrated in the top of FIG. 11, the nonvolatile memory system 100 may perform the cell-count operation by using a first reference voltage Vref1. The first reference voltage Vref1 may be in a threshold voltage distribution range of an erase state E. The nonvolatile memory system 100 may detect the number of memory cells (i.e., on-cells) having a threshold voltage lower than the first reference voltage Vref1 by using the first reference voltage Vref1. In example embodiments, when threshold voltages of memory cells are changed due to read disturbance, the number of on-cells that are determined based on the first reference voltage Vref1 may be smaller than a first reference number. The first reference number indicates the number of memory cells, each of which has a threshold voltage lower than the first reference voltage Vref1, from among memory cells having an erased state E before read disturbance.

Alternatively, as illustrated in the bottom of FIG. 11, the nonvolatile memory system 100 may perform a cell count operation by using a second reference voltage Vref2. The second reference voltage Vref2 may be in a threshold voltage distribution range of a third program state P3. The nonvolatile memory system 100 may detect the number of memory cells (i.e., off-cells) having a threshold voltage higher than the second reference voltage Vref2 by using the second reference voltage Vref2. In example embodiments, when threshold voltages of memory cells are changed due to charge loss, the number of off-cells that are determined based on the second reference value Vref2 may be smaller than a second reference number. The second reference number indicates the number of memory cells, each of which has a threshold voltage higher than the second reference voltage Vref2, from among the memory cells having a third program state P3 before charge loss. The first and second reference number may also be called a first reference count and a second reference count, respectively.

In operation S122, the nonvolatile memory system 100 may determine an error type of the source block based on the result of the cell-count operation. For example, as described above, the nonvolatile memory system 100 may perform the cell-count operation by using one of the first and second reference voltages Vref1 and Vref2 and may determine whether an error generated by comparing the cell-counting result with the first or second reference value is an error due to read disturbance or an error due to charge loss.

In some example embodiments, the nonvolatile memory system 100 may perform cell-count operations by using the first and second reference voltages Vref1 and Vref2 and may determine whether an error is an error due to read disturbance or an error due to charge loss based on the cell-count result.

In some example embodiments, the nonvolatile memory system 100 may perform a cell-count operation once by using one of the first and second reference voltages Vref1 or Vref2. For example, the nonvolatile memory system 100 may perform a cell-count operation by using the first reference voltage Vref1 and may determine whether an error is an error due to read disturbance, based on the cell-count result. When an error is not an error due to read disturbance (that is, when the counted value is not smaller than the first reference value), the nonvolatile memory system 100 may determine the error as being an error due to charge loss without an additional cell-count operation.

Alternatively, in some example embodiments, the nonvolatile memory system 100 may perform a cell-count operation by using the second reference voltage Vref2 and may determine whether an error is an error due to charge loss, based on the cell-count result. When an error is not an error due to charge loss (that is, when the counted value is not smaller than the second reference value), the nonvolatile memory system 100 may determine the error as being an error due to read disturbance. Alternatively, in some example embodiments, the nonvolatile memory system 100 may perform a cell-count operation by using both the first and second reference voltage Vref1 and Vref2, and may determine whether an error is an error due to a read disturbance or due to charge loss based on which cell-count is greater.

Figure 12:
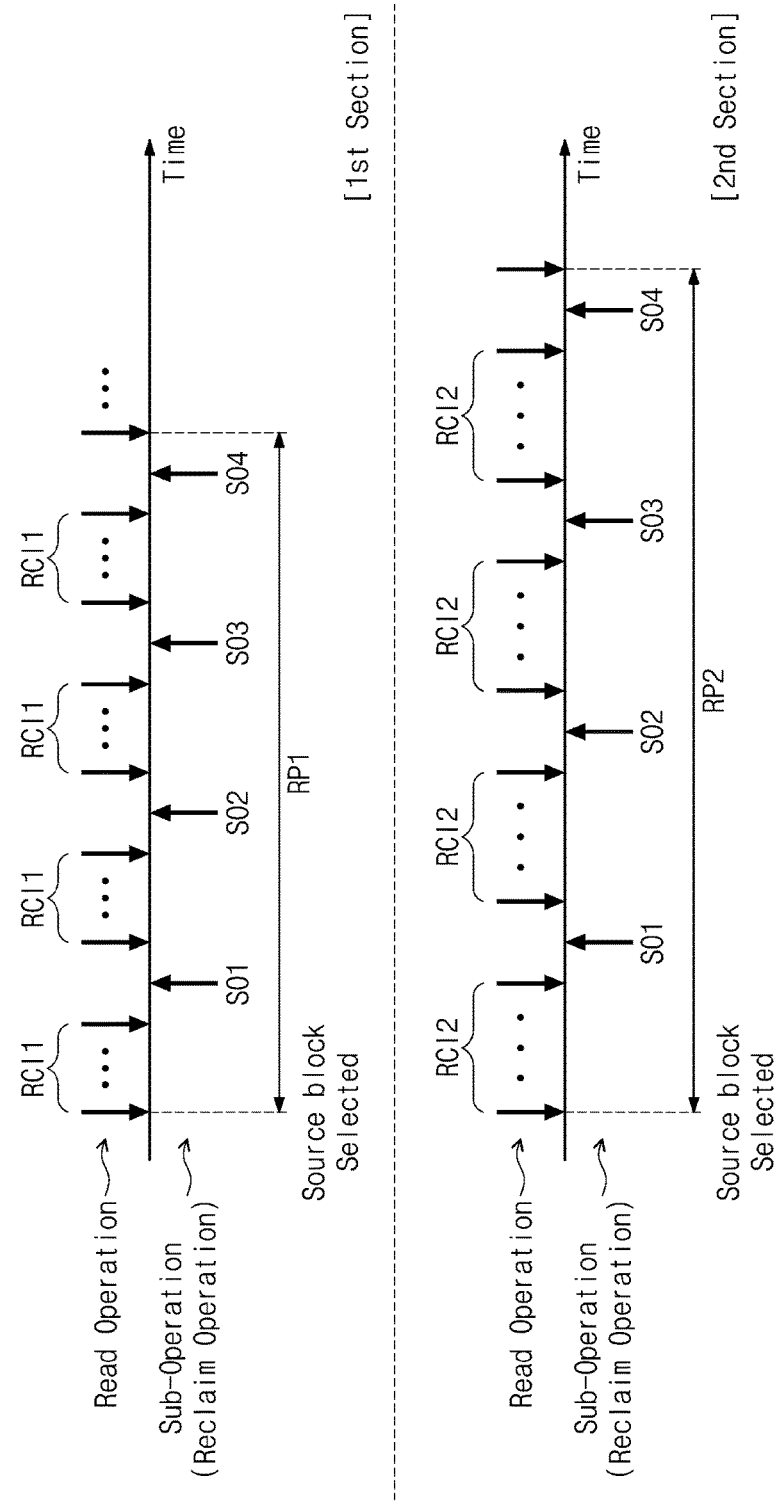
FIGS. 12 to 14 are timing diagrams for describing operation S130 and operation S140 of the operation method of FIG. 9.
Figure 13:
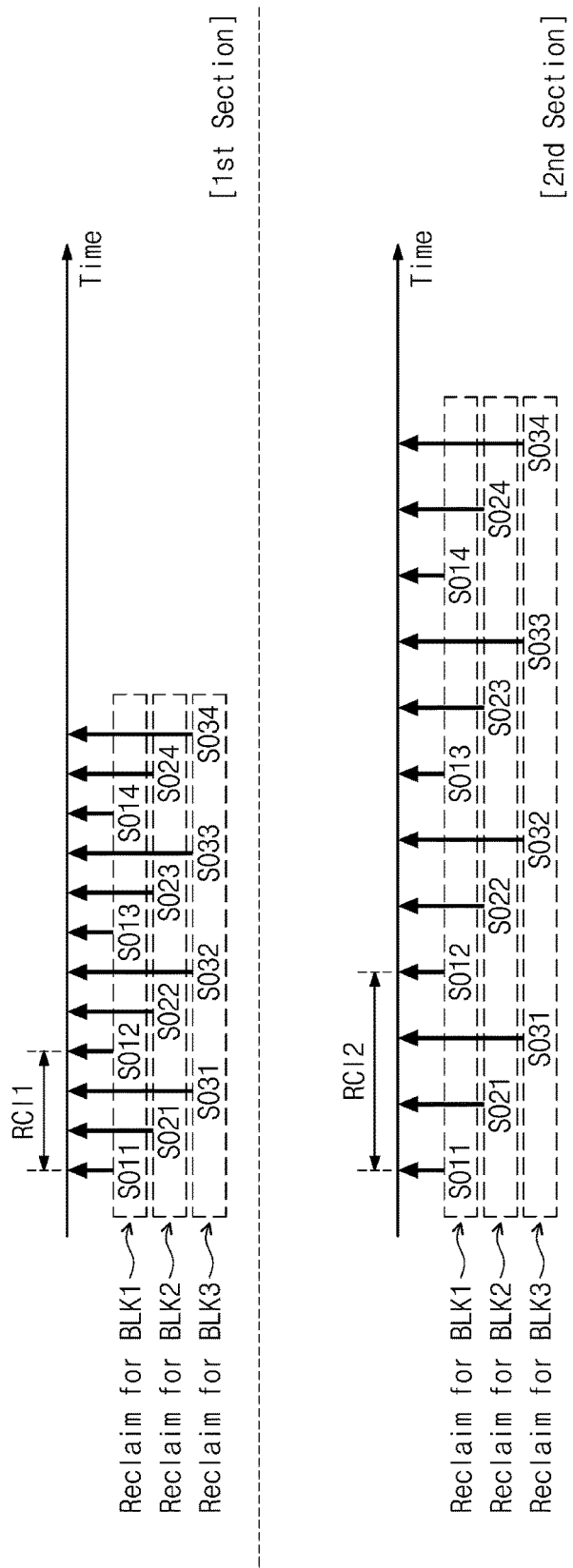
Figure 14:
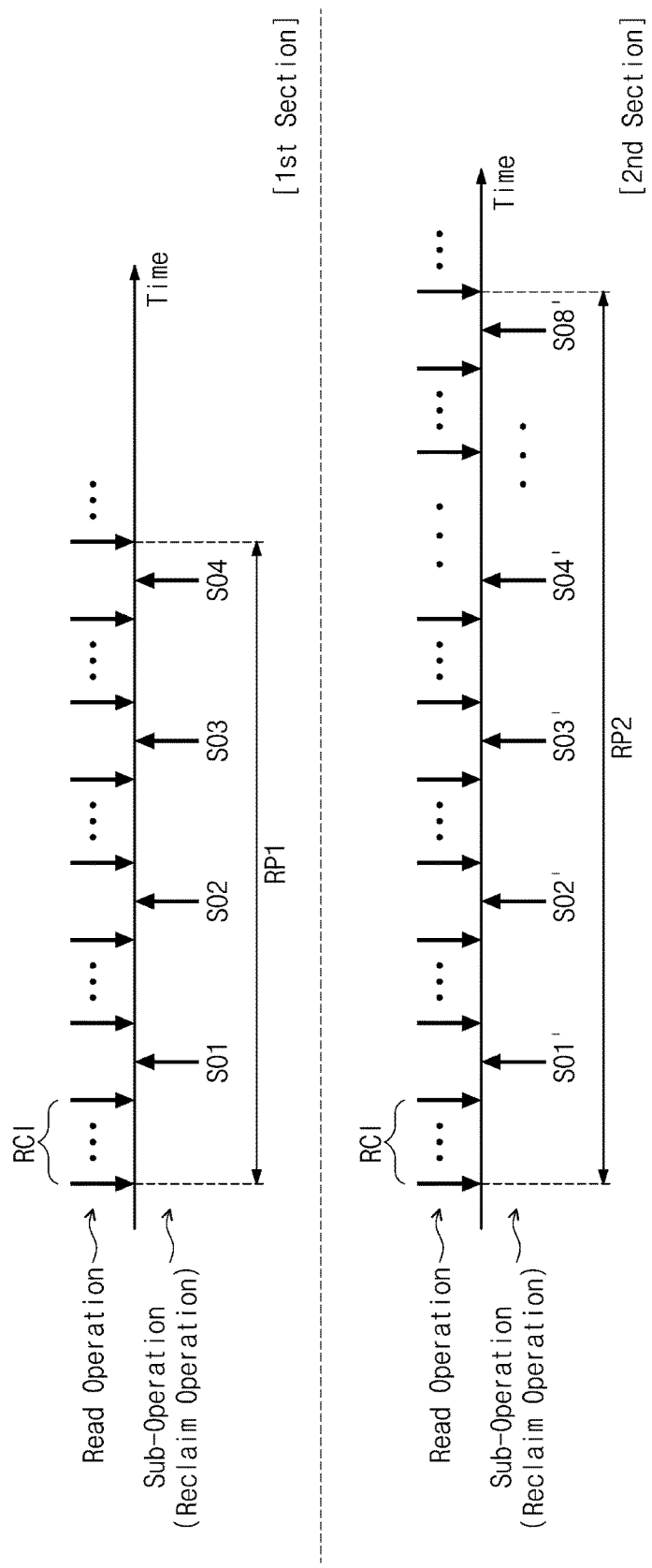

FIGS. 12 to 14 are timing diagrams for describing operation S130 and operation S140 of the operation method of FIG. 9. For descriptive convenience, it is assumed that a read operation of the nonvolatile memory system 100 is performed in a read intensive case. That is, it is assumed that the nonvolatile memory system 100 repeatedly performs a read operation based on the request of an external device. In addition, it is assumed that a reclaim operation about one source block includes first to fourth sub-operations S01 to S04. That is, that the first to fourth sub-operations S01 to S04 are performed with respect to one source block may mean that a reclaim operation about one source block is completed.

First, referring to FIGS. 1, 9 and 12, the nonvolatile memory system 100 may select a source block. The nonvolatile memory system 100 may adjust a reclaim policy based on an error type of the selected source block. In example embodiments, the reclaim policy may include factors such as reclaim speed, a reclaim execution period, a read count interval, and a sub-operation unit.

When the error type of the source block is determined as being a read disturbance error, the nonvolatile memory system 100 may adjust a reclaim policy such that a sub-operation is performed every first read count interval RCI1. For example, as illustrated in a first section of FIG. 12, after the first read count interval RCI1 from a point in time when a source block is selected, a first sub-operation S01 may be performed. The first sub-operation S01 is performed, and the second sub-operation S02 may be performed after another of the first read count interval RCI1. That is, the nonvolatile memory system 100 may perform each of the first to fourth sub-operations S01 to S04 after a respective first read count interval RCI1. A reclaim operation of the selected source block may be completely performed during the first reclaim execution period RP1. In example embodiments, a read count interval (RCI) may indicate the number of read operations, according to the request of the external device, between two adjacent sub-operations.

When the error type of the source block is determined as being an error due to charge loss, the nonvolatile memory system 100 may adjust a reclaim policy such that a sub-operation is performed every second count interval RCI2 greater than the first read count interval RCI1. For example, as illustrated in a second section of FIG. 12, after the second read count interval RCI2 from a point in time when a source block is selected, the first sub-operation S01 may be performed. The first sub-operation S01 may be performed, and a second sub-operation S02 may be performed after another of the second read count interval RCI2. That is, the nonvolatile memory system 100 may perform each of the first to fourth sub-operations S01 to S04 after a respective second read count interval RCI2. A reclaim operation of the selected source may be completely performed during the second reclaim execution period RP2.

As illustrated in FIG. 12, the second read count interval RCI2 may be greater than the first read count interval RCI1, and the second reclaim execution period RP2 may be greater than the first reclaim execution period RP1. That is, when an error due to charge loss is included in the source block, the nonvolatile memory system 100 may increase an interval in which a sub-operation of a reclaim operation is performed.

Next, an effect according to an example embodiment will be described with reference to FIGS. 1 and 13. For descriptive convenience and ease of illustration, it may be assumed that first to third memory blocks BLK1 to BLK3 include an error due to charge loss and the first to third memory blocks BLK1 to BLK3 are selected as a source block during a specific time or a specific time period. A first section of FIG. 13 is a timing diagram illustrating a reclaim operation according to a related art, and a second section of FIG. 13 is a timing diagram illustrating a reclaim operation according to an example embodiment.

Referring to FIGS. 1 and 13, the first to third memory blocks BLK1 to BLK3 including an error due to charge loss may be selected as a source block. The nonvolatile memory system 100 may sequentially perform a reclaim operation with respect to the first to third memory blocks BLK1 to BLK3. In example embodiments, a reclaim operation with respect to the first memory block BLK1 may include sub-operations S011 to S014, a reclaim operation with respect to the second memory block BLK2 may include sub-operations S021 to S024, and a reclaim operation with respect to the third memory block BLK3 may include sub-operations S031 to S034.

As illustrated in the first section of FIG. 13, because a reclaim policy is not adjusted in the related art, a related art nonvolatile memory system may perform sub-operations of a reclaim operation with respect to each block every first read count interval RCI1. That is, a sub-operation S011 with respect to the first memory block BLK1 may be performed, and a sub-operation S012 may be performed after the first read count interval RCI1. In addition, a sub-operation S021 with respect to the second memory block BLK2 may be performed, and a sub-operation S022 may be performed after the first read count interval RCI1. Similarly, each of sub-operations S011 to S014, S021 to S024, and S031 to S034 may be performed after respective first read count intervals RCI1. At this time, reclaim operations with respect to the first to third memory blocks BLK1 to BLK3 may be performed to be overlapped with each other, and thus the performance of the nonvolatile memory system may decrease.

On the other hand, as illustrated in a second section of FIG. 13, the nonvolatile memory system 100 according to an example embodiment may adjust an interval, in which a sub-operation is performed, to the second read count interval RCI2 greater than the first read count interval RCI1. That is, the sub-operation S011 with respect to the first memory block BLK1 may be performed, and the sub-operation S012 may be performed after the second read count interval RCI2. In addition, the sub-operation S021 with respect to the second memory block BLK2 may be performed, and the sub-operation S022 may be performed after the second read count interval RCI2. Similarly, each of sub-operations S011 to S014, S021 to S024, and S031 to S034 may be performed after respective second read count intervals RCI2.

As illustrated in FIG. 13, the nonvolatile memory system 100 according to an example embodiment may increase an interval in which a sub-operation is performed during a reclaim operation with respect to a source block including an error due to charge loss, thereby minimizing the overall performance degradation of the nonvolatile memory system 100. In more detail, when a plurality of source blocks including an error due to charge loss are selected, the nonvolatile memory system 100 according to an example embodiment may perform sub-operations, of which the number is smaller than the number of sub-operations of a related art nonvolatile memory system, during the same time. That the number of sub-operations is small may mean that read operations according to the request of an external device are further performed. The number of sub-operations may be inversely proportional to the number of read operations according to the request of an external device during the same time. That is, when a plurality of source blocks including an error due to charge loss are selected, the nonvolatile memory system 100 according to an example embodiment may perform read operations, of which the number is less than the number of read operations in a related art nonvolatile memory system, based on the request of the external device during the same time, thereby improving the performance of the nonvolatile memory system 100.

Next, referring to FIGS. 1 and 14, the nonvolatile memory system 100 may select a source block. The nonvolatile memory system 100 may adjust a reclaim policy based on an error type of the selected source block. In example embodiments, unlike an example embodiment of FIG. 12, in the example embodiment of FIG. 14, the nonvolatile memory system 100 may adjust a sub-operation unit. In example embodiments, the sub-operation unit may indicate an amount of data to be processed while a sub-operation is performed once.

For example, when the error type of a source block is determined as being an error due to read disturbance, the nonvolatile memory system 100 may perform the first to fourth sub-operations S01 to S04 with respect to one source block. Each of the first to fourth sub-operations S01 to S04 may be performed after a respective specific read count interval RCI. That is, when the first to fourth sub-operations S01 to S04 are performed with respect to one source block including an error due to read disturbance, a reclaim operation with respect to the one source block may be completed. At this time, the reclaim operation with respect to the one source block may be performed during a first reclaim execution period RP1.

In contrast, when the error type of the source block is determined as being an error due to charge loss, the nonvolatile memory system 100 may perform first to eighth sub-operations S01' to S08' with respect to the one source block. Each of the sub-operations S01' to S08' may be performed after a respective specific read count interval RCI. That is, when the first to eighth sub-operations S01' to S08' are performed with respect to the one source block, a reclaim operation with respect to the one source block may be completed. The reclaim operation about the one source block may be performed during the second reclaim execution period RP2.

In example embodiments, each operation unit of sub-operations S01 to S04 illustrated in a first section of FIG. 14 may be different from that of sub-operations S01' to S08' illustrated in a second section of FIG. 14. For example, it is assumed that the source block includes eight pieces of page data. In this case, each of the sub-operations S01 to S04 of the first section in FIG. 14 may include an operation of reading two pieces of page data and an operation of programming the two pieces of read page data in a destination block. On the other hand, each of the sub-operations S01' to S08' of the second section in FIG. 14 may include an operation of reading a piece of page data from a source block and an operation of programming the piece of read page data in a destination block. That is, the nonvolatile memory system 100 may adjust a sub-operation unit based on an error type, thereby preventing the performance of the nonvolatile memory system 100 from being degraded as described with reference to FIG. 13.

As described above, the nonvolatile memory system 100 according to an example embodiment may adjust a reclaim policy based on the error type of the source block. Even though source blocks are simultaneously selected, the performance degradation may be minimized. Accordingly, the nonvolatile memory system with the improved performance and reliability thereof may be provided.

Figure 15:
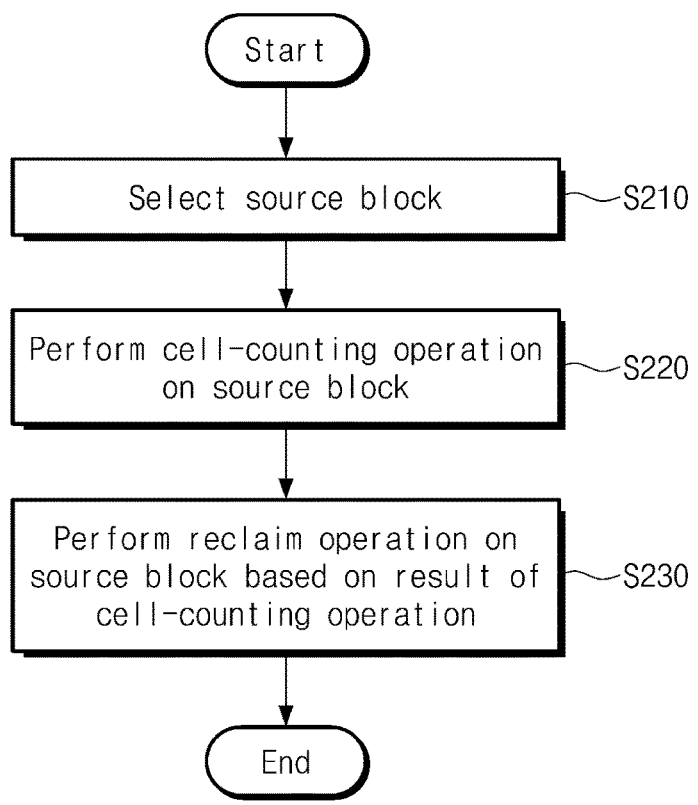
FIG. 15 is a flow chart illustrating an operation method of a nonvolatile memory system according to an example embodiment.

FIG. 15 is a flow chart illustrating an operation method of a nonvolatile memory device 110 according to an example embodiment. Referring to FIGS. 1 and 15, in operation S210, the nonvolatile memory system 100 may select a source block.

In operation S220, the nonvolatile memory system 100 may perform a cell-counting operation on the source block by using at least one reference voltage. For example, as described with reference to FIGS. 10 and 11, the nonvolatile memory system 100 may perform a cell-counting operation by using the first reference voltage Vref1 or the second reference voltage Vref2. Alternatively, in some example embodiments, the nonvolatile memory system 100 may perform a cell-counting operation using both the first reference voltage Vref1 and the second reference voltage Vref2.

In operation S230, the nonvolatile memory system 100 may perform a reclaim operation on the source block based on a result of the cell-counting operation. For example, as described with reference to FIGS. 10 to 13, the nonvolatile memory system 100 may determine an error type of the source block through the cell-counting operation. The nonvolatile memory system 100 may control a reclaim operation based on the error type of the source block.

In example embodiments, an error type determination method according to an example embodiment may be an example, and an embodiment of the inventive concept may not be limited thereto. For example, the nonvolatile memory system 100 may manage program time of memory blocks and may determine an error type (i.e., a kind of error type due to charge loss) based on the program time of the source block. That is, when a difference (e.g., program lapse time) between the program time of the selected source block and current time is greater than or equal to reference time, the nonvolatile memory system 100 may determine an error type of the selected source block as an error due to charge loss and may perform a reclaim operation based on the operation method described with reference to FIGS. 1 to 15. Alternatively, the nonvolatile memory system 100 may manage a read count after an erase about each of a plurality of memory blocks and may determine an error type (i.e., a kind of error type due to read disturbance) based on the read count. That is, when a read count is greater than or equal to a frequency, the nonvolatile memory system 100 may determine an error of the selected source block and may perform a reclaim operation based on an operation method described with reference to FIGS. 1 to 15.

Figure 16:
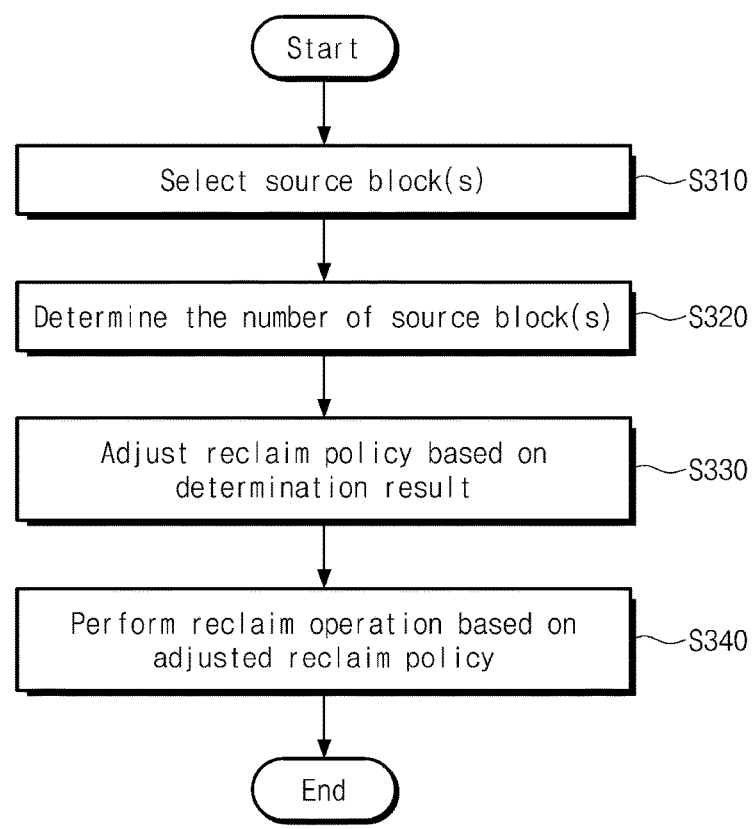
FIG. 16 is a flow chart illustrating an operation method of a nonvolatile memory system according to an example embodiment.

FIG. 16 is a flow chart illustrating an operation method of a nonvolatile memory system according to an example embodiment. Referring to FIGS. 1 and 16, in operation S310, the nonvolatile memory system 100 may select a source block.

In operation S320, the nonvolatile memory system 100 may determine the number of source block(s). For example, in operation S310, the nonvolatile memory system 100 may determine the number of the selected source blocks. Alternatively, the nonvolatile memory system 100 may determine the number of the selected source blocks and the source blocks each experiencing a reclaim operation.

In operation S330, the nonvolatile memory system 100 may adjust a reclaim policy based on the determination result. For example, when the number of the determined source blocks is greater than or equal to a reference value, this may mean that the number of source blocks, in each of which reclaim operations are performed at the same time (or in parallel), are two or more. In this case, the nonvolatile memory system 100 may adjust a reclaim policy as with the adjusting of a reclaim policy, which includes an error due to charge loss, described with reference to FIGS. 1 to 14.

Alternatively, when the number of the determined source blocks is not greater than or equal to the reference value, the nonvolatile memory system 100 may adjust a reclaim policy as with the adjusting of a reclaim policy, which includes a read disturbance loss error, described with reference to FIGS. 1 to 14.

Afterwards, the nonvolatile memory system 100 may perform an operation of operation S340. The operation of operations S340 may be similar to that of operation S140 of FIG. 9, and a detailed description thereof is thus omitted.

As described above, the nonvolatile memory system 100 according to an example embodiment may adjust a reclaim policy based on the number of source blocks. That is, even though a plurality of source blocks are selected during a specific time or a specific time period, the nonvolatile memory system 100 may perform a reclaim operation while the performance degradation thereof is minimized. Accordingly, the nonvolatile memory system with the improved performance and reliability thereof may be provided.

Figure 17:
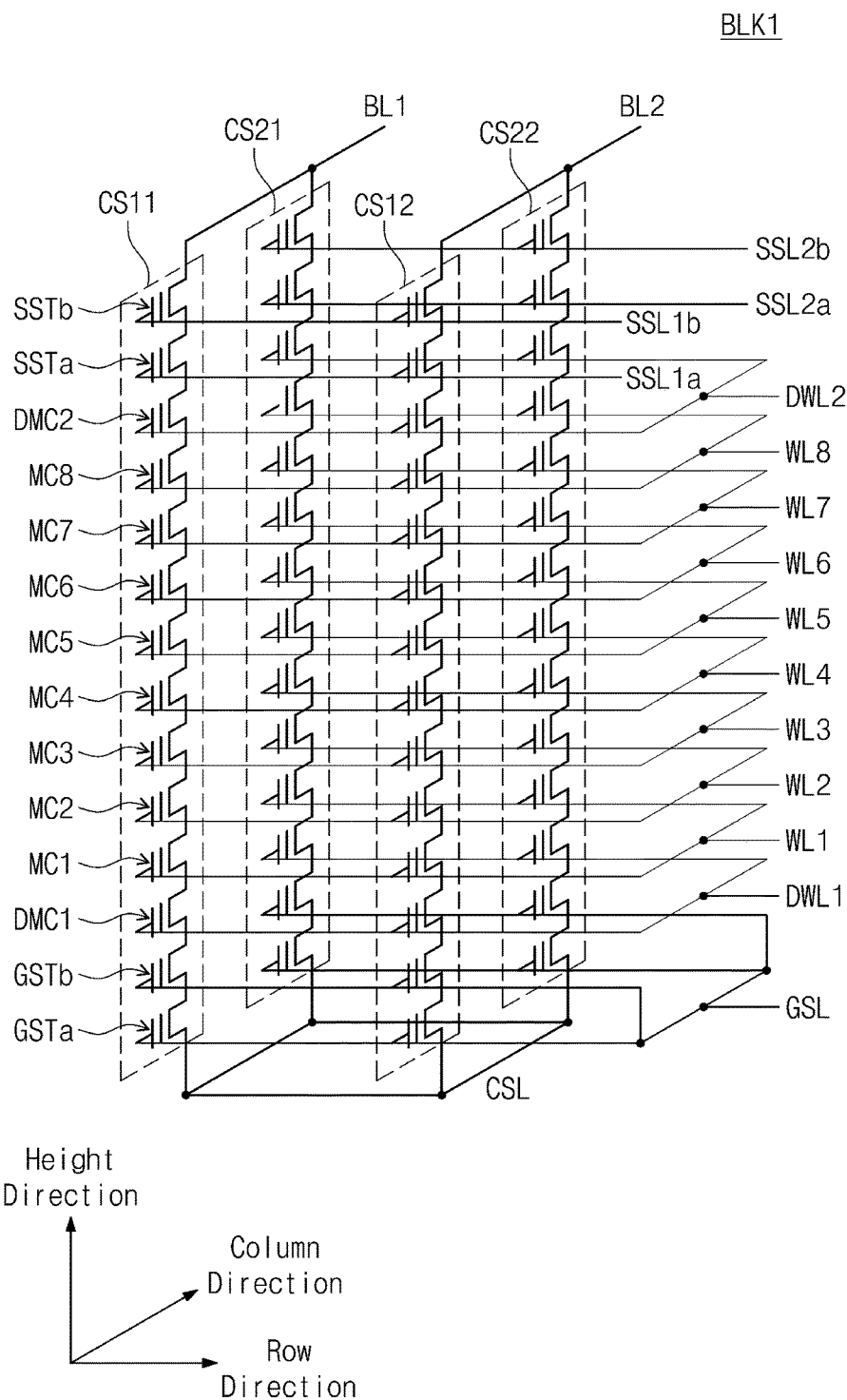
FIG. 17 is a circuit diagram illustrating a first memory block of memory blocks included in a nonvolatile memory device according to an example embodiment.

FIG. 17 is a circuit diagram illustrating a first memory block of memory blocks included in a nonvolatile memory device according to an example embodiment. In example embodiments, the first memory block BLK1 of a three-dimensional structure is described with reference to FIG. 17. However, an example embodiment is not limited thereto, and other memory blocks may also have a structure which is similar to the first memory block BLK1.

Referring to FIG. 17, the first memory block BLK1 may include a plurality of cell strings CS11, CS12, CS21, and CS22. The cell strings CS11, CS12, CS21, and CS22 may be arranged along a row direction and a column direction and may form rows and columns.

Each of the cell strings CS11, CS12, CS21, and CS22 may include a plurality of cell transistors. Each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2. In example embodiments, each of the memory cells included in the cell strings CS11, CS12, CS21, and CS22 may be a charge trap flash (CTF) memory cell.

A plurality of memory cells MC1 to MC8 may be serially connected and may be stacked in a height direction being a direction perpendicular to a plane defined by the row direction and the column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In example embodiments, a first dummy memory cell DMC1 may be disposed between the memory cells MC1 to MC8 and the ground selection transistors GSTa and GSTb. In example embodiments, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL.

In example embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

In example embodiments, ground selection transistors provided at the same height from a substrate may be connected to the same ground selection line, and ground selection transistors provided at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, memory cells MC1 to MC8 of the cell strings CS11, CS12, CS21, and CS22 may be connected in common to first to eighth word lines WL1 to WL8, respectively. String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

String selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In example embodiments, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

In example embodiments, the first memory block BLK1 illustrated in FIG. 16 may be an example. For example, the number of cell strings may increase or decrease, and the number of rows of cell strings and the number of columns of cell strings may increase or decrease according to the number of cell strings. In addition, in the first memory block BLK1, the number of cell strings (GST, MC, DMC, SST, or the like) may increase or decrease, and the height of the first memory block BLK1 may increase or decrease according to the number of cell strings. Furthermore, the number of lines (GSL, WL, DWL, SSL, or the like) connected with cell transistors may increase or decrease according to the number of cell strings (GST, MC, DMC, SST, or the like).

Figure 18:
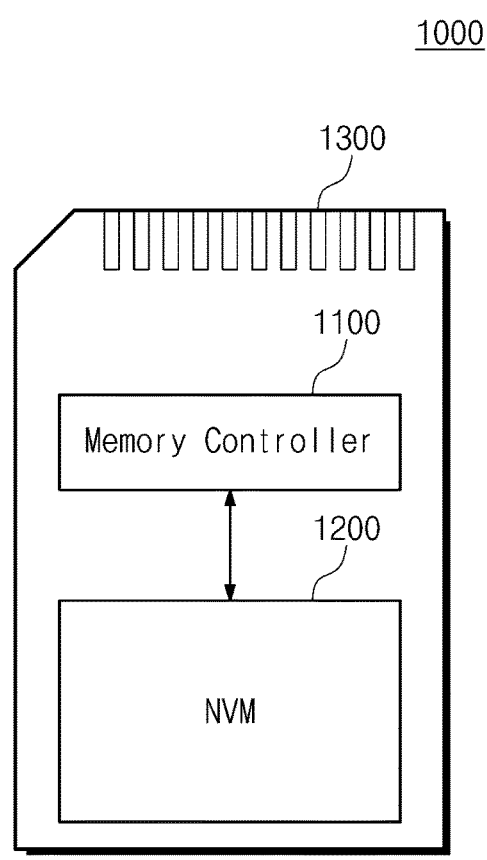
FIG. 18 is a block diagram illustrating a memory card system including a nonvolatile memory system according to an example embodiment.

FIG. 18 is a block diagram illustrating a memory card system including a nonvolatile memory system according to an example embodiment. In example embodiments, a memory card system 1000 of FIG. 18 may operate according to an operation method of the nonvolatile memory system described with reference to FIGS. 1 to 16. Referring to FIG. 18, a memory card system 1000 may include a controller 1100, a nonvolatile memory (NVM) 1200, and a connector 1300.

The controller 1100 may be connected to the nonvolatile memory 1200. The controller 1100 may be configured to access the nonvolatile memory 1200. For example, the controller 1100 may be at least one microprocessor adapted to control an overall operation of the nonvolatile memory 1200 including a read operation, a write operation, an erase operation, and a background operation. The background operation may include the following operations: wear-leveling management, garbage collection, and the like.

The controller 1100 may provide an interface between the nonvolatile memory 1200 and a host. The controller 1100 may be implemented to drive firmware for controlling the nonvolatile memory 1200.

In example embodiments, the controller 1100 may include components such as, but not limited to, a RAM, a central processing unit, a host interface, a memory interface, and an error correction unit.

The controller 1100 may communicate with an external device through the connector 1300. The controller 1100 may communicate with the external device (e.g., host) based on a specific communication protocol. For example, the controller 1100 may communicate with the external device through at least one of various communication protocols such as, but not limited to, universal serial bus (USB), multimedia card (MMC), eMMC (embedded MMC), peripheral component interconnection (PCI), PCI-express (PCI-E), advanced technology attachment (ATA), a serial-ATA, parallel-ATA, small computer small interface (SCSI), enhanced small disk interface (ESDI), integrated drive electronics (IDE), Firewire, universal flash storage (UFS), non-volatile memory express (NVMe), and the like.

The nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM), and the like.

In example embodiments, the controller 1100 and the nonvolatile memory 1200 may be integrated in a single semiconductor device. In example embodiments, the controller 1100 and the nonvolatile memory 1200 may be integrated in a single semiconductor device to form a solid state drive (SSD). The controller 1100 and the nonvolatile memory 1100 may be integrated in a single semiconductor device to constitute a memory card. For example, the controller 1100 and the nonvolatile memory 1200 may be integrated in a single semiconductor device to compose a memory card such as, a personal computer memory card international association (PCMCIA) card, a compact flash card (CF), a smart media card (e.g., SM or SMC), a memory stick, a multimedia card (e.g., MMC, RS-MMC, MMCmicro, and eMMC), an SD card (e.g., SD, miniSD, microSD, and SDHC), a universal flash storage (UFS), or the like.

The nonvolatile memory 1200 or the memory card system 1000 may be mounted with a variety of types of packages. For example, the nonvolatile memory 1200 or the memory card system 1000 may be packaged and mounted with a package; package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline integrated circuit (SOIC), shrink small outline package (SSOP), thin small outline package (TSOP), thin quad flat package (TQFP), system in package (SIP), multichip package (MCP), wafer-level fabricated package (WFP), wafer-level processed stack package (WSP), or the like.

Figure 19:
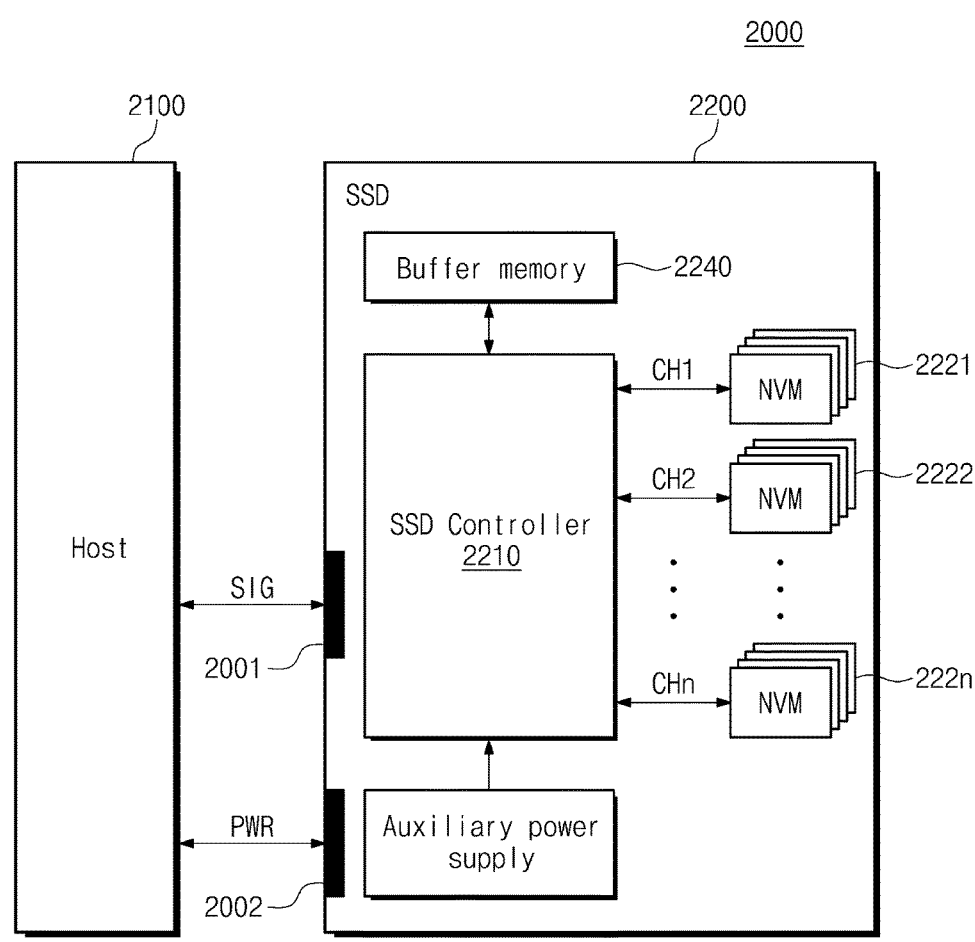
FIG. 19 is a block diagram illustrating a solid state drive (SSD) system including a nonvolatile memory system according to an example embodiment.

FIG. 19 is a block diagram illustrating a solid state drive (SSD) including a nonvolatile memory system according to an example embodiment. In example embodiments, a SSD system 2000 of FIG. 19 may operate according to an operation method of a nonvolatile memory system described with reference to FIGS. 1 to 16. Referring to FIG. 19, a solid state drive (SSD) system 2000 may include a host 2100 and an SSD 2200. The SSD 2200 may exchange signals SIG with the host 2100 through a signal connector 2001 and may be supplied with a power PWR through a power connector 2002. The SSD 2200 may include an SSD controller 2210, a plurality of nonvolatile memories (NVMs) 2221 to 222n, an auxiliary power supply 2230, and a buffer memory 2240.

The SSD controller 2210 may control the nonvolatile memories (NVMs) 2221 to 222n in response to the signal from the host 2100. The nonvolatile memories (NVMs) 2221 to 222n may be flash memories and may perform a program operation in response to control of the SSD controller 2210.

The auxiliary power supply 2230 may be connected to the host 2100 via the power connector 2002. The auxiliary power supply device 2230 may receive the power PWR from the host 2100 and may be charged with the received power PWR. When a power is not smoothly supplied from the host 2100, the auxiliary power supply device 2230 may supply an auxiliary power to the SSD 2200. The auxiliary power supply 2230 may be placed inside or outside the SSD 2200. For example, the auxiliary power supply device 2230 may be put on a main board or a separate printed circuit board to supply the auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 322n. The buffer memory 2240 may include volatile memories such as a DRAM, a SDRAM, a DDR SDRAM, an LPDDR SDRAM, an SRAM, and the like or nonvolatile memories such as a FRAM a ReRAM, a STT-MRAM, a PRAM, and the like.

Figure 20:
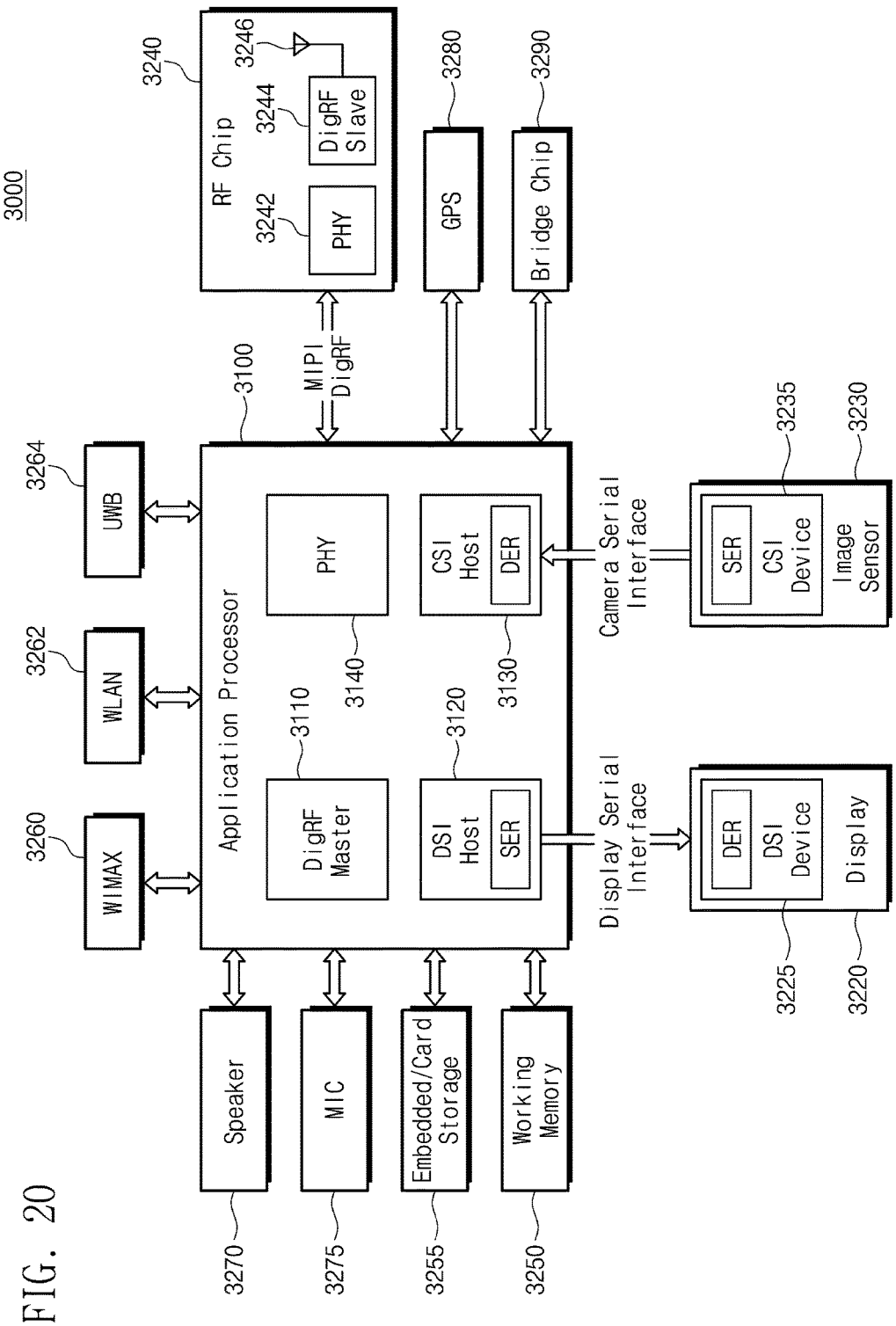
FIG. 20 is a block diagram illustrating a configuration of an electronic system including a nonvolatile memory system according to an example embodiment.

FIG. 20 is a block diagram illustrating a configuration of an electronic system including a nonvolatile memory system according to an example embodiment. In example embodiments, an electronic system 3000 may be implemented with a data processing device capable of using or supporting an interface offered by mobile industry processor interface (MIPI) alliance. In example embodiments, the electronic system 3000 may be implemented with a form such as a portable communication terminal, a personal digital assistant (PDA), a portable multimedia player (PMP), a smart phone, or a wearable device.

Referring to FIG. 20, the electronic system 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 through the DSI. In example embodiments, an optical serializer SER may be implemented in the DSI host 3120. In example embodiments, an optical deserializer DES may be implemented in the DSI device 3225.

The CSI host 3130 may communicate with a CSI device 3235 of the image sensor 3230 through a CSI. In example embodiments, an optical deserializer DES may be implemented in the CSI host 3130. In example embodiments, an optical serializer may be implemented in the CSI device 3235.

The electronic system 3000 may further include a radio frequency (RF) chip 3240 for communicating with the application processor 3100. The RF chip 3240 may include a physical layer 3242, a DigRF slave 3244, and an antenna 3246. In example embodiments, the physical layer 3242 of the RF chip 3240 and the physical layer 3140 of the application processor 3100 may exchange data with each other through DigRF interface offered by MIPI alliance.

The electronic system 3000 may further include a working memory 3250 and embedded/card storage 3255. The working memory 3250 and the embedded/card storage 3255 may store data received from the application processor 3100. The working memory 3250 and the embedded/card storage 3255 may provide the data stored therein to the application processor 3100.

The working memory 3250 may temporarily store data, which was processed or will be processed by the application processor 3100. The working memory 3250 may include a nonvolatile memory, such as a flash memory, a PRAM, an MRAM, a ReRAM, or a FRAM, or a volatile memory, such as an SRAM, a DRAM, or an SDRAM.

The embedded/card storage 3255 may store data regardless of a power supply. In example embodiments, the embedded/card storage 3255 may comply with the UFS interface protocol. However, the spirit and scope of the inventive concept may not be limited thereto. In example embodiments, the embedded/card storage 3255 may include a nonvolatile memory system described with reference to FIGS. 1 to 18. The embedded/card storage 3255 may perform a reclaim operation based on an operation method described with reference to FIGS. 1 to 16.

The electronic system 3000 may communicate with an external system through a communication module such as a worldwide interoperability for microwave access (WiMAX) 3260, a wireless local area network (WLAN) 3262, and an ultra-wideband (UWB) 3264, or the like.

The electronic system 3000 may further include a speaker 3270 and a microphone 3275 for processing voice information. The electronic system 3000 may further include a global positioning system (GPS) device 3280 for processing position information. The electronic system 3000 may further include a bridge chip 3290 for managing connections between peripheral devices.

In example embodiments, the nonvolatile memory device (NVM) may include a 3-dimensional memory array. The 3-dimensional memory array may be monolithically formed in one or more physical level(s) of a memory cell array having an active area arranged on a circuit related on a silicon substrate and an operation of memory cells. The circuit related on an operation of memory cells may be located in a substrate or on a substrate. A term "monolithically" may mean that layers of each level in a 3-dimensional array are directly deposited on layers of low-level in the 3-dimensional array.

According to an exemplary embodiment, the 3-dimensional memory array may have a vertical-directional characteristic, and may include vertical NAND strings in which at least one memory cell is located on another memory cell. At least one memory cell may include a charge trap layer.

Each vertical NAND string may include at least one select transistor located over memory cells. At least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to an example embodiment, the nonvolatile memory system may perform a reclaim operation with respect to a source block, thereby improving the reliability of the nonvolatile memory system. In this case, the nonvolatile memory system may adjust a reclaim policy based on an error type of the source block, thereby preventing the performance from being reduced due to the reclaim operation. Accordingly, the nonvolatile memory system having the improved reliability and performance may be provided.

Example embodiments provide an operation method of a nonvolatile memory system having an improved performance and reliability thereof by adjusting a reclaim policy based on an error type of a source block.

While the inventive concept has been described with reference to example embodiments, it will be apparent to those skilled in the art that various changes and modifications may be made without departing from the spirit and scope of the inventive concept. Therefore, it should be understood that the above example embodiments are not limiting, and it is to be understood that the technical value substantially affects the equivalent scope of the inventive concept.

What is claimed is:

1. An operation method of a nonvolatile memory system, the method comprising:
    selecting a source block of a plurality of memory blocks;
    performing a cell-counting with respect to the selected source block based on at least one reference voltage; and
    performing a reclaim operation on the source block based on a result of the cell-counting, and
    wherein the performing of the reclaim operation comprises:
    performing the reclaim operation during a first reclaim execution period when the result is greater than a reference value;
    performing the reclaim operation during a second reclaim execution period different from the first reclaim execution period when the result is not greater than the reference value, and
    wherein each of the first reclaim execution period and the second reclaim execution period indicates a read count interval from a first point in time when the source block is selected to a second point in time when the reclaim operation is completed.

2. The method of claim 1, wherein the read count interval is an interval of a read count, and the read count indicates a number of read operations on the plurality of memory blocks.

3. The method of claim 1, wherein the read count interval is an interval of a read count, and the read count indicates a number of read operations on the source block.

4. The method of claim 1, wherein the at least one reference voltage is included in a threshold voltage distribution range of a erase state of a plurality of memory cells, wherein the result indicates a number of on-cells, which are determined based on the at least one reference voltage, from among memory cells of the source block, and wherein the first reclaim execution period is greater than the second reclaim execution period.

5. The method of claim 1, wherein the at least one reference voltage is included in a threshold voltage distribution range of a most program state of a plurality of memory cells, wherein the result indicates a number of off-cells, which are determined based on the at least one reference voltage, from among memory cells of the source block, and wherein the first reclaim execution period is smaller than the second reclaim execution period.

6. An operation method of a nonvolatile memory system, the method comprising:

selecting a source block of a plurality of memory blocks;

performing a cell-counting with respect to the selected source block based on at least one reference voltage; and performing a reclaim operation on the source block based on a result of the cell-counting, wherein the reclaim operation comprises a plurality of sub-operations, and wherein the performing of the reclaim operation comprises:

sequentially performing the sub-operations every first read count during a first reclaim execution period when the result is greater than a reference value; and sequentially performing the sub-operations every second read count different from the first read count when the result is not greater than the reference value.

7. The method of claim 6, wherein each of the plurality of sub-operations comprises at least one of:

reading at least one page data from the source block, correcting an error of the at least one page data, and programming the at least one page data, in which the error is corrected, in a destination block.

8. The method of claim 1, wherein the reclaim operation comprises a plurality of sub-operations, and wherein the performing of the reclaim operation comprises:

performing each of the plurality of sub-operations based on a first sub-operation unit when the result is greater than a reference value; and performing each of the plurality of sub-operations based on a second sub-operation unit different from the first sub-operation unit when the result is not greater than the reference value.

9. The method of claim 8, wherein each of first and second the sub-operation units indicates a data processing unit of the sub-operation.

10. The method of claim 1, wherein the selecting of the source block comprises:

reading data from a memory block of the plurality of memory blocks;

detecting an error of the read data; and selecting the memory block as the source block when a number of the detected errors is greater than a reference value.

11. The method of claim 1, wherein each of the memory blocks comprises a three-dimensional memory array.

\* \* \* \* \*